(12) United States Patent
Qing

(10) Patent No.: US 11,893,918 B2
(45) Date of Patent: Feb. 6, 2024

(54) SHIFT REGISTER UNIT, METHOD FOR DRIVING THE SAME, DRIVING CIRCUIT AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 191 days.

(21) Appl. No.: 17/595,075

(22) PCT Filed: Jan. 28, 2021

(86) PCT No.: PCT/CN2021/074101
§ 371 (c)(1),
(2) Date: Nov. 8, 2021

(87) PCT Pub. No.: WO2022/160166
PCT Pub. Date: Aug. 4, 2022

(65) Prior Publication Data
US 2023/0298500 A1    Sep. 21, 2023

(51) Int. Cl.
*G09G 3/20* (2006.01)
*G11C 19/28* (2006.01)
(52) U.S. Cl.
CPC .............. *G09G 3/20* (2013.01); *G11C 19/28* (2013.01); *G09G 2310/0286* (2013.01)

(58) Field of Classification Search
CPC ............. G09G 3/20; G09G 2310/0286; G09G 3/3677; G09G 3/3266; G11C 19/28
See application file for complete search history.

(56) References Cited

U.S. PATENT DOCUMENTS

2019/0325834 A1    10/2019 Feng et al.
2020/0066209 A1*    2/2020 Zhang .................... G11C 19/28
(Continued)

FOREIGN PATENT DOCUMENTS

CN         111145678 A      5/2020
CN         210692046 U      6/2020
(Continued)

*Primary Examiner* — Hong Zhou
(74) *Attorney, Agent, or Firm* — Brooks Kushman PC

(57) ABSTRACT

A shift register unit, a driving method, a driving circuit and a display device. The shift register unit includes a first node control circuit, a second node control circuit, an output node control circuit, an output circuit, a maintaining circuit, and a potential control circuit. The first node control circuit controls the potential of the first node, the second node control circuit controls the potential of the second node, the output node control circuit controls the connection between the output terminal and the first voltage terminal under the control of the potential of the output node, the potential control circuit control the potential of the control terminal of the maintaining circuit according to the second clock signal; the maintaining circuit controls the connection between the output terminal and the second voltage terminal under the control of a potential of the control terminal of the maintaining circuit.

20 Claims, 10 Drawing Sheets

(56) References Cited

U.S. PATENT DOCUMENTS

2020/0143731 A1* 5/2020 Zheng .................. G09G 3/20
2020/0152283 A1  5/2020 Qing
2021/0193025 A1  6/2021 Xu et al.

FOREIGN PATENT DOCUMENTS

CN    210956110 U   7/2020
WO    2020015569 A1  1/2020

* cited by examiner

//SHIFT REGISTER UNIT, METHOD FOR DRIVING THE SAME, DRIVING CIRCUIT AND DISPLAY DEVICE

CROSS-REFERENCE TO RELATED APPLICATION

This application is the U.S. national phase of PCT Application No. PCT/CN2021/074101 filed on Jan. 28, 2021, which is incorporated herein by reference in its entirety.

TECHNICAL FIELD

The present disclosure relates to the field of display technology, in particular to a shift register unit, a driving method, a driving circuit and a display device.

BACKGROUND

Existing Organic Light Emitting Diode (OLED) display panels generally use p-type transistor technology to implement all backplane circuits. In real applications, high-level pulses are often required to achieve light-emitting control. However, it is difficult to setup a shift register unit with a high-level pulse through a p-type transistor in the prior art.

SUMMARY

In a first aspect, the present disclosure provides in some embodiments a shift register unit, including: a first node control circuit, a second node control circuit, an output node control circuit, an output circuit, a maintaining circuit, and a potential control circuit, wherein: the first node control circuit is electrically connected to a first clock signal terminal, an input terminal, and a first node, and is configured to control the connection between the input terminal and the first node under the control of a first clock signal provided by the first clock signal terminal; the second node control circuit is electrically connected to a node control terminal, the first clock signal terminal, a first voltage terminal, the first node, a second node, and a third node, respectively, is configured to control a potential of the third node according to a potential of the node control terminal, a first voltage signal provided by the first voltage terminal, and the first clock signal, and control a potential of the second node according to the first clock signal and the first voltage signal under the control of the potential of the third node and the potential of the first node; the output node control circuit is electrically connected to the first node, the second node, the second clock signal terminal, the output node, and the first voltage terminal, respectively, and is configured to control a potential of the output node under the control of the potential of the second node and the second clock signal provided by the second clock signal terminal according to the second clock signal, and control the connection between the output node and the first voltage terminal under the control of the potential of the first node, and is configured to maintain the potential of the output node; the output circuit is electrically connected to the output node, the first voltage terminal, and the output terminal, respectively, is configured to control the connection between the output terminal and the first voltage terminal under the control of the potential of the output node; the potential control circuit is electrically connected to a control terminal of the maintaining circuit and the second clock signal terminal, respectively, is configured to control the potential of the control terminal of the maintaining circuit according to the second clock signal; the control terminal of the maintaining circuit is electrically connected to the first node, the maintaining circuit is also electrically connected to the output terminal and the second voltage terminal, is configured to control the connection between the output terminal and the second voltage terminal under the control of a potential of the control terminal of the maintaining circuit.

Optionally, the second node control circuit includes a third node control sub-circuit and a second node control sub-circuit, wherein, the third node control sub-circuit is electrically connected to the node control terminal, the third node, the first voltage terminal, and the first clock signal terminal, respectively, and is configured to control the connection between the third node and the first voltage terminal under the control of the potential of the node control terminal, and control the potential of the third node according to the first clock signal; the second node control sub-circuit is electrically connected to the third node, the second node, the first clock signal terminal, the first node, and the first voltage terminal, respectively, is configured to control the connection between the second node and the first clock signal terminal under the control of the potential of the third node, and control the connection between the second node and the first voltage terminal under the control of the potential of the first node.

Optionally, the node control terminal is the input terminal or the first node.

Optionally, the third node control sub-circuit includes a first transistor and a first capacitor; a control electrode of the first transistor is electrically connected to the node control terminal, a first electrode of the first transistor is electrically connected to the first voltage terminal, and a second electrode of the first transistor is electrically connected to the third node; a first terminal of the first capacitor is electrically connected to the first clock signal terminal, and a second terminal of the first capacitor is electrically connected to the third node.

Optionally, the second node control sub-circuit includes a second transistor and a third transistor, wherein, a control electrode of the second transistor is electrically connected to the first node, a first electrode of the second transistor is electrically connected to the first voltage terminal, and a second electrode of the second transistor is electrically connected to the second node; a control electrode of the third transistor is electrically connected to the third node, a first electrode of the third transistor is electrically connected to the first clock signal terminal, and a second electrode of the third transistor is electrically connected to the second node.

Optionally, the first node control circuit is electrically connected to the first voltage terminal and the second node, and is configured to control the connection between the first node and the first voltage terminal under the control of the potential of the second node.

Optionally, the first node control circuit includes a fourth transistor and a fifth transistor, wherein, a control electrode of the fourth transistor is electrically connected to the second node, a first electrode of the fourth transistor is electrically connected to the first voltage terminal, and a second electrode of the fourth transistor is electrically connected to the first node; a control electrode of the fifth transistor is electrically connected to the first clock signal terminal, a first electrode of the fifth transistor is electrically connected to the input terminal, and a second electrode of the fifth transistor is electrically connected to the first node.

Optionally, the shift register unit further includes a first isolation circuit, wherein the control terminal of the maintaining circuit is electrically connected to the first node through the first isolation circuit; the first isolation circuit is configured to control the connection or disconnection between the first node and the control terminal of the maintaining circuit under the control of the first control voltage provided by the first control voltage terminal.

Optionally, the first isolation circuit includes a first isolation transistor, a control electrode of the first isolation transistor is electrically connected to the first control voltage terminal, and a first electrode of the first isolation transistor is electrically connected to the first node, and a second electrode of the first isolation transistor is electrically connected to the control terminal of the maintaining circuit; the first control voltage terminal is the second voltage terminal.

Optionally, the shift register unit further includes a second isolation circuit; the output node control circuit is electrically connected to the second node through the second isolation circuit; the second isolation circuit is configured to control the connection or disconnection between the second node and the output node control circuit under the control of a second control voltage provided by the second control voltage terminal.

Optionally, the second isolation circuit includes a second isolation transistor; the output node control circuit is electrically connected to the second node through the second isolation transistor; a control electrode of the second isolation transistor is electrically connected to the second control voltage terminal, a first electrode of the second isolation transistor is electrically connected to the second node, and a second electrode of the second isolation transistor is electrically connected to the output node control circuit.

Optionally, the first node control circuit is electrically connected to the first voltage terminal and a first control node respectively, and is configured to control the connection between the first node and the first voltage terminal under the control of the potential of the first control node; the first control node is the second node or a node electrically connected to the output node control circuit.

Optionally, the first node control circuit includes a fourth transistor and a fifth transistor, wherein, a control electrode of the fourth transistor is electrically connected to the first control node, a first electrode of the fourth transistor is electrically connected to the first voltage terminal, and a second electrode of the fourth transistor is electrically connected to the first node; a control electrode of the fifth transistor is electrically connected to the first clock signal terminal, a first electrode of the fifth transistor is electrically connected to the input terminal, and a second electrode of the fifth transistor is electrically connected to the first node.

Optionally, the output node control circuit includes a sixth transistor, a seventh transistor, an eighth transistor, a second capacitor, and a third capacitor, wherein, a control electrode of the sixth transistor is electrically connected to the second node, a first electrode of the sixth transistor is electrically connected to the second clock signal terminal, and a second electrode of the sixth transistor is electrically connected to a fourth node; a control electrode of the seventh transistor is electrically connected to the second clock signal terminal, a first electrode of the seventh transistor is electrically connected to the fourth node, and a second electrode of the seventh transistor is electrically connected to the output node; a control electrode of the eighth transistor is electrically connected to the first node, a first electrode of the eighth transistor is electrically connected to the first voltage terminal, and a second electrode of the eighth transistor is electrically connected to the output node; a first terminal of the second capacitor is electrically connected to the control electrode of the sixth transistor, and a second terminal of the second capacitor is electrically connected to the fourth node; a first terminal of the third capacitor is electrically connected to the output node, and a second terminal of the third capacitor is electrically connected to the first voltage terminal.

Optionally, the maintaining circuit includes a ninth transistor, and the output circuit includes a tenth transistor, wherein, a control electrode of the ninth transistor is electrically connected to the control terminal of the maintaining circuit, a first electrode of the ninth transistor is electrically connected to the output terminal, and a second electrode of the ninth transistor is electrically connected to the second voltage terminal; a control electrode of the tenth transistor is electrically connected to the output node, a first electrode of the tenth transistor is electrically connected to the first voltage terminal, and a second electrode of the tenth transistor is electrically connected to the output terminal.

Optionally, the potential control circuit includes a fourth capacitor; a first terminal of the fourth capacitor is electrically connected to the control terminal of the maintaining circuit, and a second terminal of the fourth capacitor is electrically connected to the second clock signal terminal; or, the potential control circuit includes the fourth capacitor and a thirteenth transistor; the first terminal of the fourth capacitor is electrically connected to the control terminal of the maintaining circuit; a control electrode of the thirteenth transistor is connected to the control terminal of the maintaining circuit, a first electrode of the thirteenth transistor is connected to the second terminal of the fourth capacitor, and a second electrode of the thirteenth transistor is electrically connected to the second clock signal terminal.

Optionally, the potential control circuit is electrically connected to the second node, the first voltage terminal, and the second control node, respectively, is configured to control the connection between the second control node and the first voltage terminal under the control of the potential of the second node, and control the connection between the second control node and the second clock signal terminal under the control of the potential of the control terminal of the maintaining circuit, and control the potential of the control terminal of the maintaining circuit according to the potential of the second control node.

Optionally, the potential control circuit includes a fourth capacitor, a thirteenth transistor, and a fourth transistor; a control electrode of the fourth transistor is electrically connected to the second node, a first electrode of the fourth transistor is electrically connected to the first voltage terminal, and a second electrode of the fourth transistor is electrically connected to the second control node; a control electrode of the thirteenth transistor is electrically connected to the control terminal of the maintaining circuit, a first electrode of the thirteenth transistor is electrically connected to the second control node, and a second electrode of the thirteenth transistor is electrically connected to the second clock signal terminal; a first terminal of the fourth capacitor is electrically connected to the control terminal of the maintaining circuit, and a second terminal of the fourth capacitor is electrically connected to the second control node.

In a second aspect, an embodiment of the present disclosure provides a driving method applied to the shift register unit, the driving cycle includes a first phase, a second phase, and a third phase arranged in sequence; the driving method includes: in the first phase, the first node control circuit controlling the potential of the first node to be the first voltage, and the potential control circuit maintaining the potential of the first node at the first voltage; the second node control circuit controlling the potential of the second node to be the second voltage, the output node control circuit controlling the potential of the output node to maintain at the first voltage, and the output circuit and the maintaining circuit controlling the output terminal to maintain the output of the second voltage signal; in the second phase, the first node control circuit controlling the potential of the first node to be the first voltage, the second node control circuit controlling the potential of the second node to the second voltage, and the output node control circuit controlling the potential of the output node to be the second voltage, and the output circuit controlling the output terminal to output the first voltage signal; in the third phase, the first node control circuit controlling the potential of the first node to be the second voltage, the potential control circuit maintaining the potential of the first node at the second voltage, and the second node control circuit controlling the potential of the second node to be the first voltage, the output node control circuit controlling the potential of the output node to be the first voltage, and the maintaining circuit controlling the output terminal to output the second voltage signal.

Optionally, the driving cycle further includes a fourth phase arranged after the third phase; the driving method further includes: in the fourth phase, the second node control circuit controlling the potential of the second node to be the first voltage, the potential control circuit controlling to pull down the potential of the first node, and the maintaining circuit controlling the output terminal to output the second voltage signal.

Optionally, the driving method specifically includes: in the first phase, the input signal provided by the input terminal being the first voltage signal, the first clock signal provided by the first clock signal terminal being the second voltage signal, and the second clock signal provided by the second clock signal terminal being the first voltage signal, the first node control circuit writing the input signal to the first node under the control of the first clock signal; the second node control circuit correspondingly changing the potential of the third node according to the first clock signal, so that the second node control circuit controls the first clock signal terminal to write the first clock signal to the second node under the control of the potential of the third node; the potential control circuit maintaining the potential of the first node at the first voltage, the output node control circuit controlling the potential of the output node to maintain at the first voltage under the control of the potential of the first node, the potential of the second node and the second clock signal, and the output circuit and the maintaining circuit controlling the output terminal to maintain the output of the second voltage signal; in the second phase, the input signal being the second voltage signal, the first clock signal being the first voltage signal, the second clock signal being the second voltage signal, and the first node control circuit controlling the potential of the first node to be the first voltage; the second node control circuit setting the potential of the third node to the first voltage according to the potential of the node control terminal and the first clock signal, and the second node control circuit controlling the potential of the second node to be the second voltage under the control of the potential of the third node and the potential of the first node; the output node control circuit controlling the potential of the output node to be the second voltage under the control of the potential of the second node and the second clock signal, and the output circuit controlling the connection between the output terminal and the first voltage terminal under the control of the potential of the output node, to control the output terminal to output the first voltage signal; in the third phase, the input signal being the second voltage signal, the first clock signal being the second voltage signal, and the second clock signal being the first voltage signal, the first node control circuit controlling to write the input signal into the first node under the control of the first clock signal, so that the potential of the first node is the second voltage, and the potential control circuit maintaining the potential of the first node at the second voltage; the second node control circuit controlling the potential of the third noted to be the first voltage according to the potential of the node control terminal, the first voltage signal and the first clock signal; the second node control circuit controlling the potential of the second node to be the first voltage under the control of the potential of the third node and the potential of the first node, the output node control circuit controlling the potential of the output node to be the first voltage under the control of the potential of the first node; the maintaining circuit controlling the output terminal to output the second voltage signal under the control of the potential of the first node.

Optionally, the driving cycle further includes a fourth phase arranged after the third phase; the driving method further includes: in the fourth phase, the input signal being the second voltage signal, the first clock signal being the first voltage signal, and the second clock signal being the second voltage signal, the potential control circuit controlling to pull down the potential of the first node, and the second node control circuit controlling the potential of the second node to be the first voltage, the output node control circuit controlling the potential of the output node to be the first voltage, and the maintaining circuit controlling to pull down the potential of the signal outputted by the output terminal under the control of the potential of the first node.

In a third aspect, an embodiment of the present disclosure provides a driving circuit including a plurality of stages of shift register units.

In a fourth aspect, the present disclosure provides in some embodiments a display device including the above driving circuit.

DETAILED DESCRIPTION

The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

The transistors used in all the embodiments of the present disclosure may be triodes, thin film transistors or field effect transistors or other devices with the same characteristics. In the embodiments of the present disclosure, in order to distinguish the two electrodes of the transistor other than the control electrode, one of the electrodes is called the first electrode, and the other electrode is called the second electrode.

In actual operation, when the transistor is a triode, the control electrode can be a base, the first electrode can be a collector, and the second electrode can be an emitter; or, the control electrode can be a base, the first electrode may be an emitter, and the second electrode may be a collector.

In actual operation, when the transistor is a thin film transistor or a field effect transistor, the control electrode may be a gate electrode, the first electrode may be a drain electrode, and the second electrode may be a source electrode; or the control electrode may be a gate electrode, the first electrode may be a source electrode, and the second electrode may be a drain electrode.

Figure 1:
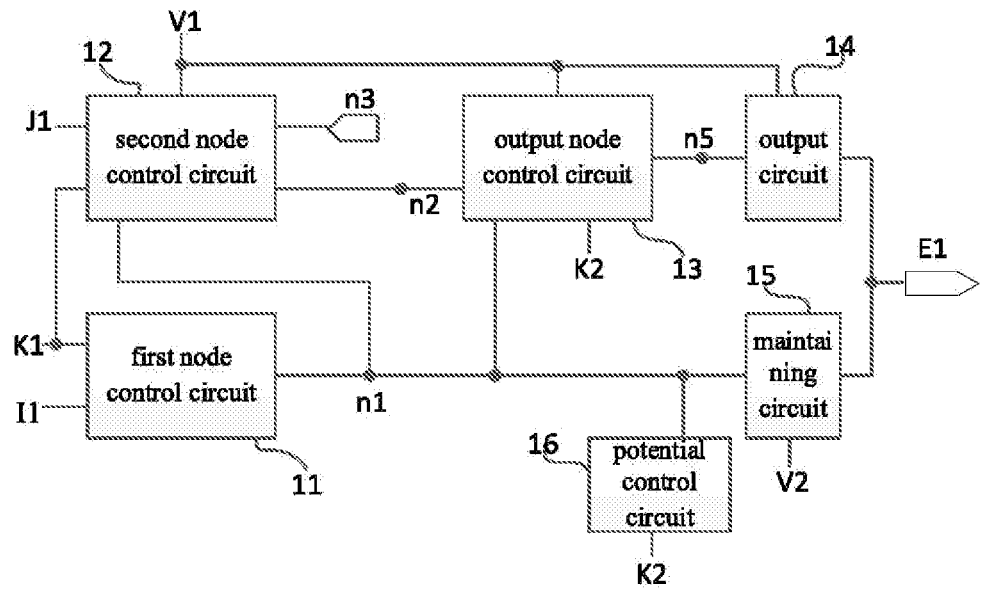
FIG. 1 is a structural diagram of a shift register unit according to at least one embodiment of the present disclosure.

As shown in FIG. 1, the shift register unit according to the embodiment of the present disclosure includes a first node control circuit 11, a second node control circuit 12, an output node control circuit 13, an output circuit 14, a maintaining circuit 15 and a potential control circuit 16.

The first node control circuit 11 is electrically connected to the first clock signal terminal K1, the input terminal I1, and the first node n1, and is used to control the connection between the input terminal I1 and the first node n1 under the control of the first clock signal provided by the first clock signal terminal K1.

The second node control circuit 12 is electrically connected to the node control terminal J1, the first clock signal terminal K1, the first voltage terminal V1, the first node n1, the second node n2, and the third node n3, respectively, is used to control the potential of the third node n3 according to the potential of the node control terminal J1, the first voltage signal provided by the first voltage terminal V1, and the first clock signal, and control the potential of the second node n2 according to the first clock signal and the first voltage signal under the control of the potential of the third node n3 and the potential of the first node n1.

The output node control circuit 13 is electrically connected to the first node n1, the second node n2, the second clock signal terminal K2, the output node n5, and the first voltage terminal V1, respectively, and is configured to control the potential of the output node n5 under the control of the potential of the second node n2 and the second clock signal provided by the second clock signal terminal K2 according to the second clock signal, and control the connection between the output node n5 and the first voltage terminal V1 under the control of the potential of the first node n1, and is configured to maintain the potential of the output node n5.

The output circuit 14 is electrically connected to the output node n5, the first voltage terminal V1, and the output terminal E1, respectively, is configured to control the connection between the output terminal E1 and the first voltage terminal V1 under the control of the potential of the output node n5.

The potential control circuit 16 is electrically connected to the control terminal of the maintaining circuit 15 and the second clock signal terminal K2, respectively, is configured to control the potential of the control terminal of the maintaining circuit 15 according to the second clock signal;

The control terminal of the maintaining circuit 15 is electrically connected to the first node n1. The maintaining circuit 15 is also electrically connected to the output terminal E1 and the second voltage terminal V2, is configured to control the connection between the output terminal E1 and the second voltage terminal V2 under the control of the potential of the control terminal.

In at least one embodiment of the present disclosure, the first voltage terminal V1 may be a high voltage terminal, the second voltage terminal V2 may be a low voltage terminal, the first voltage signal may be a high voltage signal, and the second voltage signal can be a low voltage signal; but it is not limited to this.

In the embodiments of the present disclosure, a shift register unit that outputs a high-level pulse can be constructed by using a p-type transistor.

In the embodiment of the present disclosure, the input signal is used to close the pull-up control on the capacitive coupling point (the capacitive coupling point is the third node n3), and the clock signal is transmitted through the capacitive coupling to provide the pull-up start signal (the pull-up start signal is the voltage signal of the second node n2), and the pull-up control signal (the pull-up control signal is the voltage signal of the fourth node n4) is outputted through the bootstrap circuit, and finally the shift register unit realizes shift output of level signal opposite to the turn-on voltage of the transistor.

The shift register unit described in the embodiment of the present disclosure includes a first node control circuit 11, a second node control circuit 12, an output node control circuit 13, an output circuit 14, a maintaining circuit 15, and a potential control circuit 16, and the shift register unit of the embodiment of the present disclosure is operated under the control of the first clock signal and the second clock signal that are differentially inputted.

In at least one embodiment of the present disclosure, the shift register unit outputs a light emission control signal through E1, but is not limited to this.

When the shift register unit shown in FIG. 1 of the embodiment of the present disclosure is in operation, the driving cycle may include a first phase, a second phase, a third phase, and a fourth phase that are sequentially arranged;

In the first phase, the input signal provided by the input terminal I1 is the first voltage signal, the first clock signal provided by the first clock signal terminal K1 is the second voltage signal, and the second clock signal provided by the second clock signal terminal K2 is the first voltage signal, the first node control circuit 11 writes the input signal to the first node n1 under the control of the first clock signal; the second node control circuit 12 changes the potential of the third node n3 correspondingly according to the first clock signal, so that the second node control circuit 12 controls the first clock signal terminal K1 to write the first clock signal to the second node n2 under the control of the potential of the third node n3; the potential control circuit 16 maintains the potential of the first node n1 at the first voltage; the output node control circuit 13 controls the potential of the output node n5 to be maintained at the first voltage under the control of the potential the first node n1, the potential of the second node n2 and the second clock signal, the output circuit 14 and the maintaining circuit 15 control the output terminal E1 to maintain to output the second voltage signal;

In the second phase, the input signal is a second voltage signal, the first clock signal is a first voltage signal, and the second clock signal is a second voltage signal. The first node control circuit 11 controls the potential of the first node n1 to be the first voltage; the second node control circuit 12 sets the potential of the third node n3 to the first voltage according to the potential of the node control terminal J1 and the first clock signal, and the second node control circuit 12 controls the potential of the second node n2 to be the second voltage under the control of the potential of the third node n3 and the potential of the first node n1; the output node control circuit 13 controls the potential of the output node n5 to be the second voltage under the control of the potential of the second node n2 and the second clock signal, the output circuit 14 controls the connection between the output terminal E1 and the first voltage terminal V1 under the control of the potential of the output node n5, so as to control the output terminal E1 to output the first voltage signal;

In the third phase, the input signal is the second voltage signal, the first clock signal is the second voltage signal, and the second clock signal is the first voltage signal. The first node control circuit 11 writes the input signal to the first node n1 under the control of the first clock signal, so that the potential of the first node n1 is the second voltage, and the potential control circuit 16 maintains the potential of the first node n1 at the second voltage; the second node control circuit 12 controls the potential of the third node n3 to the first voltage according to the potential of the node control terminal J1, the first voltage signal and the first clock signal; the second node control circuit 12 controls the potential of the second node n2 to the first voltage under the control of the potential of the third node n3 and the potential of the first node n1, the output node control circuit 13 controls the potential of the output node n5 to the first voltage under the control of the potential of the first node n1; the maintaining circuit 15 controls the output terminal E1 to output a second voltage signal under the control of the potential of the first node n1;

In the fourth phase, the input signal is a second voltage signal, the first clock signal is a first voltage signal, and the second clock signal is a second voltage signal. The potential control circuit 16 controls to pull down the potential of the first node n1, and the second node control circuit 12 controls the potential of the second node n2 to be the first voltage, the output node control circuit 13 controls the potential of the output node n5 to be the first voltage, and the maintaining circuit 15 controls to pull-down the potential of the signal outputted by the output terminal E1 under the control of the potential of the first node n1.

Figure 2A:
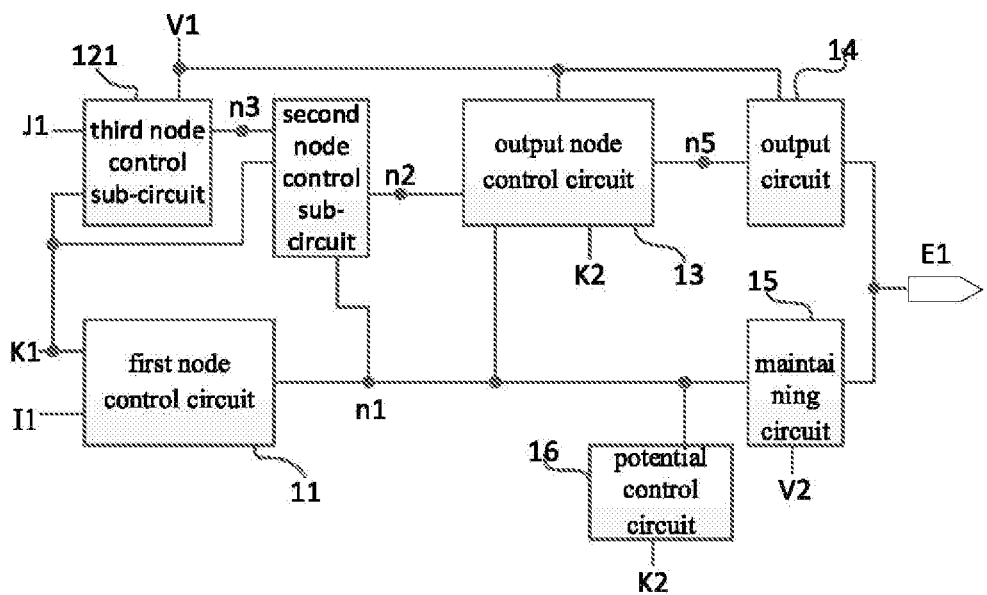
FIG. 2A is a structural diagram of a shift register unit according to at least one embodiment of the present disclosure.

In at least one embodiment of the present disclosure, as shown in FIG. 2A, based on the at least one embodiment shown in FIG. 1, the second node control circuit may include a third node control sub-circuit 121 and a second node control sub-circuit 122.

The third node control sub-circuit 121 is electrically connected to the node control terminal J1, the third node n3, the first voltage terminal V1, and the first clock signal terminal K1, respectively, and is configured to control the connection between the third node n3 and the first voltage terminal V1 under the control of the potential of the node control terminal J1, and control the potential of the third node n3 according to the first clock signal;

The second node control sub-circuit 122 is electrically connected to the third node n3, the second node n2, the first clock signal terminal K1, the first node n1, and the first voltage terminal V1, respectively, is configured to control the connection between the second node n2 and the first clock signal terminal K1 under the control of the potential of the third node n3, and to control the connection between the second node n2 and the first voltage terminal V1 under the control of the potential of the first node n1.

In specific implementation, the second node control circuit may include a third node control sub-circuit 121 and a second node control sub-circuit 122, the third node control sub-circuit 121 is used to control the potential of the third node n3, and the second node control sub-circuit 122 is used to control the potential of the second node n2 under the control of the potential of the third node n3 and the potential of the first node n1.

Optionally, the node control terminal may be the input terminal or the first node.

Optionally, the third node control sub-circuit may include a first transistor and a first capacitor;

The control electrode of the first transistor is electrically connected to the node control terminal, the first electrode of the first transistor is electrically connected to the first voltage terminal, and the second electrode of the first transistor is electrically connected to the third node.

The first terminal of the first capacitor is electrically connected to the first clock signal terminal, and the second terminal of the first capacitor is electrically connected to the third node.

Optionally, the second node control sub-circuit may include a second transistor and a third transistor, wherein, The control electrode of the second transistor is electrically connected to the first node, the first electrode of the second transistor is electrically connected to the first voltage terminal, and the second electrode of the second transistor is electrically connected to the second node.

The control electrode of the third transistor is electrically connected to the third node, the first electrode of the third transistor is electrically connected to the first clock signal terminal, and the second electrode of the third transistor is electrically connected to the second node.

Figure 2B:
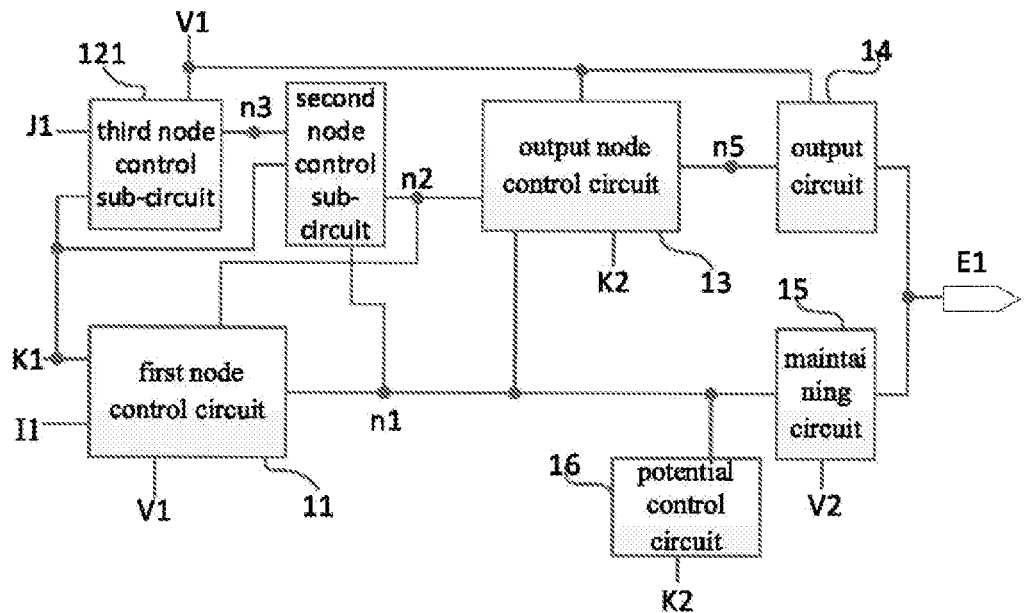
FIG. 2B is a structural diagram of a shift register unit according to at least one embodiment of the present disclosure.

As shown in FIG. 2B, based on at least one embodiment of the shift register unit shown in FIG. 2A, the first node control circuit 11 is also electrically connected to the first voltage terminal V1 and the second node n2, and is used to control the connection between the first node n1 and the first voltage terminal V1 under the control of the potential of the second node n2.

In at least one embodiment of the shift register unit shown in FIG. 2B, the first node control circuit 11 can control the connection between the first node n1 and the first voltage terminal V1 under the control of the potential of the second node n2 in the first phase and the second phase to further ensure that the potential of n1 is the first voltage.

Optionally, the first node control circuit may include a fourth transistor and a fifth transistor, wherein, The control electrode of the fourth transistor is electrically connected to the second node, the first electrode of the fourth transistor is electrically connected to the first voltage terminal, and the second electrode of the fourth transistor is electrically connected to the first node;

The control electrode of the fifth transistor is electrically connected to the first clock signal terminal, the first electrode of the fifth transistor is electrically connected to the input terminal, and the second electrode of the fifth transistor is electrically connected to the first node.

Figure 3:
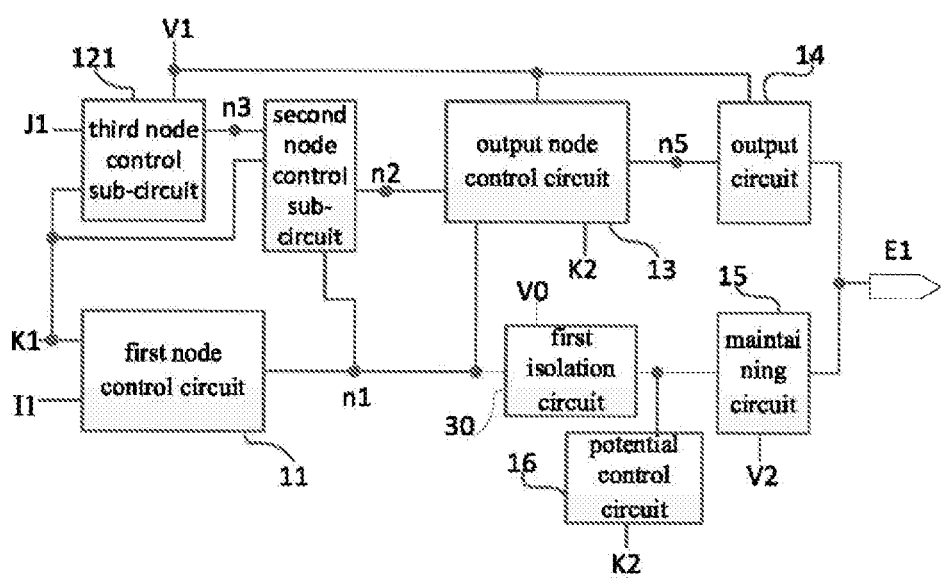
FIG. 3 is a structural diagram of a shift register unit according to at least one embodiment of the present disclosure.

In specific implementation, as shown in FIG. 3, on the basis of at least one embodiment of the shift register unit shown in FIG. 2A, the shift register unit described in at least one embodiment of the present disclosure further includes a first isolation circuit 3, the control terminal of the maintaining circuit 15 is electrically connected to the first node n1 through the first isolation circuit 30.

The first isolation circuit 30 is used to control the connection or disconnection between the first node n1 and the control terminal of the maintaining circuit 15 under the control of the first control voltage provided by the first control voltage terminal V0.

In at least one embodiment of the present disclosure, the first control voltage terminal V0 may be a low voltage terminal, but is limited to this.

In at least one embodiment of the shift register unit shown in FIG. 3, a first isolation circuit 30 is added, and the first isolation circuit 30 can disconnect the control terminal of the maintaining circuit 15 from the potential of the first node n1 when the potential of the control terminal of the maintaining circuit 15 is pull down to a low potential by the potential control circuit, to prevent the lower potential from being transmitted to the first node n1, which will affect the stability of the circuit.

Optionally, the first isolation circuit includes a first isolation transistor, a control electrode of the first isolation transistor is electrically connected to the first control voltage terminal, and a first electrode of the first isolation transistor is electrically connected to the first node, and the second electrode of the first isolation transistor is electrically connected to the control terminal of the maintaining circuit;

The first control voltage terminal is a second voltage terminal.

Optionally, the output node control circuit includes a sixth transistor, a seventh transistor, an eighth transistor, a second capacitor, and a third capacitor, wherein, The control electrode of the sixth transistor is electrically connected to the second node, the first electrode of the sixth transistor is electrically connected to the second clock signal terminal, and the second electrode of the sixth transistor is electrically connected to the fourth node.

The control electrode of the seventh transistor is electrically connected to the second clock signal terminal, the first electrode of the seventh transistor is electrically connected to the fourth node, and the second electrode of the seventh transistor is electrically connected to the output node;

The control electrode of the eighth transistor is electrically connected to the first node, the first electrode of the eighth transistor is electrically connected to the first voltage terminal, and the second electrode of the eighth transistor is electrically connected to the output node;

The first terminal of the second capacitor is electrically connected to the control electrode of the sixth transistor, and the second terminal of the second capacitor is electrically connected to the fourth node;

The first terminal of the third capacitor is electrically connected to the output node, and the second terminal of the third capacitor is electrically connected to the first voltage terminal.

Optionally, the maintaining circuit includes a ninth transistor, and the output circuit includes a tenth transistor, wherein The control electrode of the ninth transistor is the control terminal of the maintaining circuit, the first electrode of the ninth transistor is electrically connected to the output terminal, and the second electrode of the ninth transistor is electrically connected to the second voltage terminal.

The control electrode of the tenth transistor is electrically connected to the output node, the first electrode of the tenth transistor is electrically connected to the first voltage terminal, and the second electrode of the tenth transistor is electrically connected to the output terminal.

Optionally, the potential control circuit may include a fourth capacitor; the first terminal of the fourth capacitor is electrically connected to the control terminal of the maintaining circuit, and the second terminal of the fourth capacitor is connected to the second clock signal terminal; or, The potential control circuit may include a fourth capacitor and a thirteenth transistor; the first terminal of the fourth capacitor is electrically connected to the control terminal of the maintaining circuit; the control electrode of the thirteenth transistor is connected to the control terminal of the maintaining circuit, the first electrode of the thirteenth transistor is electrically connected to the second terminal of the fourth capacitor, and the second electrode of the thirteenth transistor is electrically connected to the second clock signal terminal.

Figure 4:
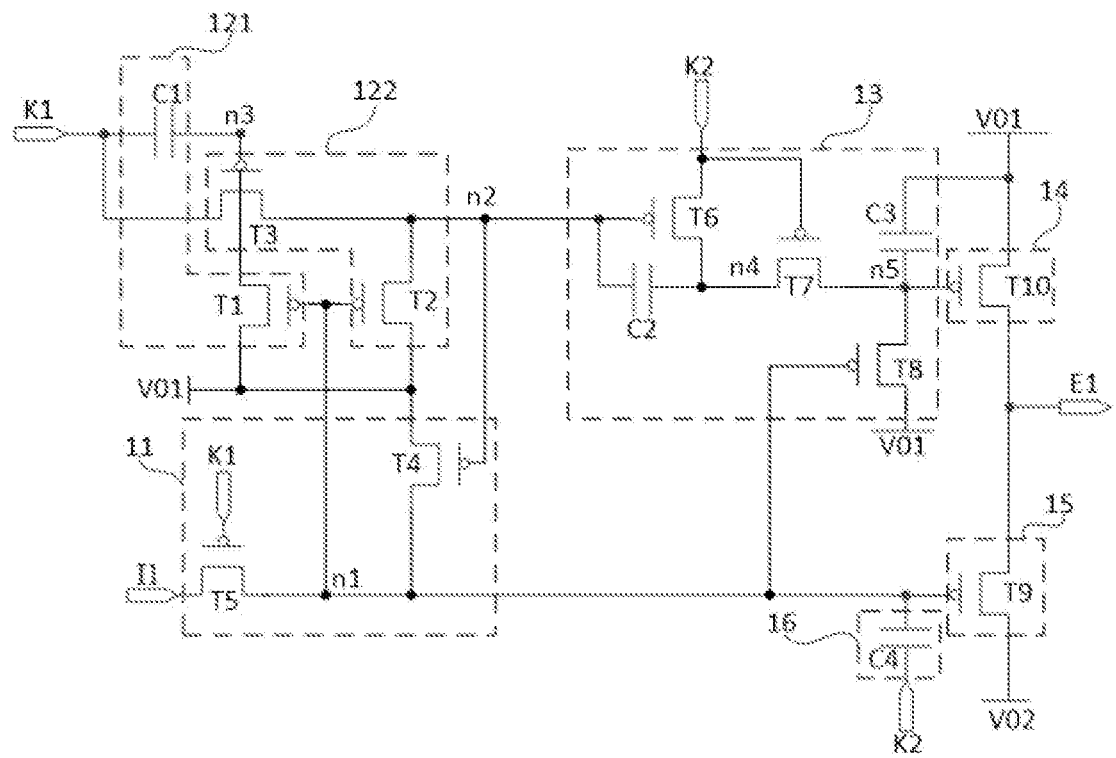
FIG. 4 is a circuit diagram of a shift register unit according to at least one embodiment of the present disclosure.

As shown in FIG. 4, based on at least one embodiment of the shift register unit shown in FIG. 2B, the third node control sub-circuit 121 may include a first transistor T1 and a first capacitor C1;

The gate electrode of the first transistor T1 is electrically connected to the first node n1, the source electrode of the first transistor T1 is electrically connected to the high voltage terminal, and the drain electrode of the first transistor T1 is electrically connected to the third node n3; the high-voltage terminal is used to provide a high-voltage signal V01;

A first terminal of the first capacitor C1 is electrically connected to the first clock signal terminal K1, and a second terminal of the first capacitor C1 is electrically connected to the third node n3;

The second node control sub-circuit 122 includes a second transistor T2 and a third transistor T3, wherein, The gate electrode of the second transistor T2 is electrically connected to the first node n1, the source electrode of the second transistor T2 is electrically connected to the high voltage terminal, and the drain electrode of the second transistor T2 is electrically connected to the second node n2;

The gate electrode of the third transistor T3 is electrically connected to the third node n3, the source electrode of the third transistor T3 is electrically connected to the first clock signal terminal K1, and the drain electrode of the third transistor T3 is electrically connected to the second node n2.

The first node control circuit 11 includes a fourth transistor T4 and a fifth transistor T5, wherein, The gate electrode of the fourth transistor T4 is electrically connected to the second node n2, the source electrode of the fourth transistor T4 is electrically connected to the high voltage terminal, and the drain electrode of the fourth transistor T4 is electrically connected to the first node n1;

The gate electrode of the fifth transistor T5 is electrically connected to the first clock signal terminal K1, the source electrode of the fifth transistor T5 is electrically connected to the input terminal I1, and the drain electrode of the fifth transistor T5 is electrically connected to the first node n1;

The output node control circuit 13 includes a sixth transistor T6, a seventh transistor T7, an eighth transistor T8, a second capacitor C2, and a third capacitor C3, wherein, The gate electrode of the sixth transistor T6 is electrically connected to the second node n2, the source electrode of the sixth transistor T6 is electrically connected to the second clock signal terminal K2, and the drain electrode of the sixth transistor T6 is electrically connected to the fourth node n4;

The gate electrode of the seventh transistor T7 is electrically connected to the second clock signal terminal K2, the source electrode of the seventh transistor T7 is electrically connected to the fourth node n4, and the drain electrode of the seventh transistor T7 is electrically connected to the output node n5;

The gate electrode of the eighth transistor T8 is electrically connected to the first node n1, the source electrode of the eighth transistor T8 is electrically connected to the high voltage terminal, and the drain electrode of the eighth transistor T8 is electrically connected to the output node n5;

The first terminal of the second capacitor C2 is electrically connected to the gate electrode of the sixth transistor T6, and the second terminal of the second capacitor C2 is electrically connected to the fourth node n4;

A first terminal of the third capacitor C3 is electrically connected to the output node n5, and a second terminal of the third capacitor C3 is electrically connected to the high voltage terminal;

The maintaining circuit 15 includes a ninth transistor T9, the output circuit 14 includes a tenth transistor T10, and the potential control circuit 16 includes a fourth capacitor C4, wherein, The gate electrode of the ninth transistor T9 is the control terminal of the maintaining circuit 15, the source electrode of the ninth transistor T9 is electrically connected to the output terminal E1, and the drain electrode of the ninth transistor T9 is electrically connected to the low voltage terminal. The low voltage terminal is used to provide a low voltage signal V02;

The gate electrode of the tenth transistor T10 is electrically connected to the output node, the source electrode of the tenth transistor T10 is electrically connected to the high voltage terminal, and the drain electrode of the tenth transistor T10 is electrically connected to the output terminal E1.

The first terminal of the fourth capacitor C4 is electrically connected to the gate electrode of the ninth transistor T9, and the second terminal of the fourth capacitor C4 is electrically connected to the second clock signal terminal K2.

In at least one embodiment of the shift register unit shown in FIG. 4, all transistors are p-type thin film transistors, but not limited to this; in actual operation, the transistors may also be PMOS transistors (P-type Metal-oxide-semiconductor transistors).

In at least one embodiment of the shift register unit shown in FIG. 4, the signal outputted by E1 may be a light emission control signal.

In at least one embodiment of the shift register unit shown in FIG. 4, the node control terminal is the first node n1.

Figure 5:
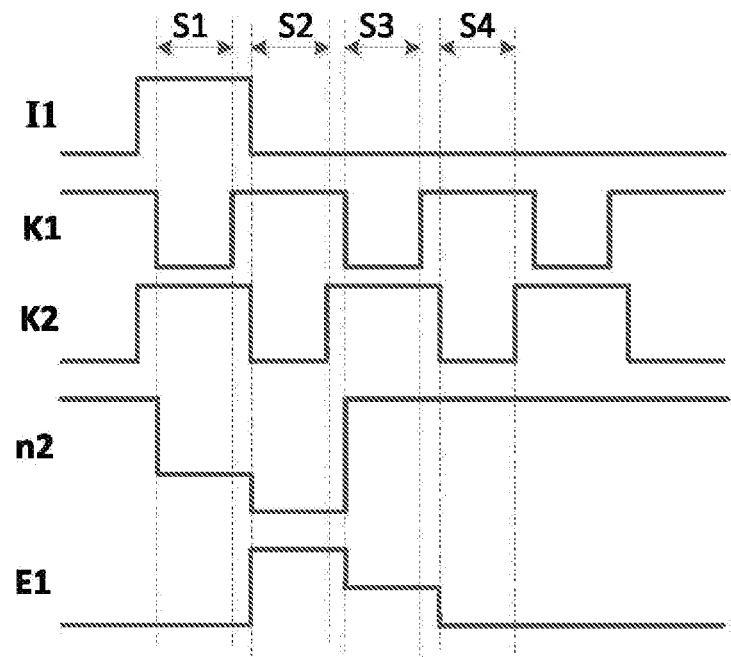
FIG. 5 is a working timing diagram of the shift register unit shown in FIG. 4 according to at least one embodiment of the present disclosure.

As shown in FIG. 5, when the shift register unit shown in FIG. 4 of at least one embodiment of the present disclosure is in operation, the driving cycle includes a first phase S1, a second phase S2, a third phase S3, and a fourth phase S4, which are sequentially arranged.

In the first phase S1, the input signal provided by I1 and the second clock signal provided by K2 are high voltage signals, the first clock signal provided by K1 is a low voltage signal, T5 is turned on, and the input signal is written to capacitor C4 through T5. At this time, the potential of n1 is high voltage, so T2, T1, T7, T8, and T9 are turned off, T1 is turned off, the potential of n3 is no longer pulled up to high voltage by T1, and n3 is in a floating state, so at the moment that the potential of the first clock signal jumps to a low level, the potential of the gate electrode of T3 is pulled down to a low voltage due to the coupling of the capacitor C1, and T3 is turned on. Since T2 is turned off, the potential of n2 is pulled down to a low voltage by the first clock signal of T3, so T4 is turned on, V01 keeps the potential of n1 at a high voltage through T4, and T6 is turned on to write the second clock signal to the fourth node n4 so that the potential of n4 is a high voltage; T9 is turned off, and T7 is turned off, the potential of n5 is maintained at the state of the previous phase, so that T10 is turned off, the state of the light-emitting control signal outputted by E1 is consistent with the state of the previous phase, and the light-emitting control signal outputted by E1 is a low voltage signal;

In the second phase S2: the input signal provided by I1 and the second clock signal provided by K2 are low voltage signals, the first clock signal provided by K1 is a high voltage signal, T5 is turned off, and T4 is turned on, so that the potential of n1 is a high voltage, T2, T1, T8, T9 are in the off state; the first clock signal provided by K1 is a high voltage signal, the potential of the gate electrode of T3 is coupled to a high voltage by C1, T3 is turned off, and the potential of n2 remains unchanged. T6 and T7 is still turned on, and the second clock signal provided by K2 is outputted by bootstrapping through T6 and capacitor C2, so that the potential of n4 is the low voltage, T7 is turned on, and the potential of n5 is the low voltage, so T10 is turned on, and E1 outputs a high voltage signal;

In the third phase S3: the input signal provided by I1 and the first clock signal provided by K1 are low voltage signals, the second clock signal provided by K2 is a high voltage signal, T5 is turned on, and the input signal is written through T5 and stored in C4, the potential of n1 is a low voltage, so T2, T1, T8, T8, T9 are turned on, T1 is turned on, and the potential of n3 is a high voltage, so the voltage jump of the first clock signal cannot affect the potential of the gate electrode of T3 through the coupling of C1, T3 is turned off, T2 is turned on, the potential of n2 is pulled up by T2 to a high voltage, so T4 and T6 are turned off, the second clock signal cannot be input through T6, T8 is turned on, and the high voltage signal is used to charge C3 through T8 to keep the potential of n5 at a high potential, thus T10 is turned off. Since T9 is turned on, E1 outputs a low voltage signal;

In the fourth phase S4, the input signal provided by I1 and the second clock signal provided by K2 are low voltage signals, the first clock signal provided by K1 is a high voltage signal, T5 is turned off, the potential of n2 is a high voltage, and the second clock signal is used to pull down the potential of the gate electrode of T9 through C4, the potential of the light-emitting control signal outputted by E1 is also pulled down.

The shift register unit shown in FIG. 4 of at least one embodiment of the present disclosure is affected by the threshold voltage during operation (the threshold voltage loss occurs when the p-type transistor transmits a low voltage signal), so in the third phase S3, the potential of the light-emitting control signal outputted by E1 will not completely reach the voltage value of the low voltage signal V02, but in the fourth phase S4, when the potential of the second clock signal changes from a high voltage to a low voltage, the potential of the gate electrode of T9 is lower through the coupling of C4, thereby further lowering the potential of the light-emitting control signal outputted by E1, but not affecting the use of the shift register unit;

In the time after S4 included in the driving period, E1 continues to output a low voltage signal before the arrival of the high voltage of the next input signal.

In the embodiment shown in FIG. 4, in the first phase, the potential of the input signal is a high voltage, and T5 is turned on to write the input signal to the gate electrode of T1 to turn off T1, and stop the pulling up the voltage of the third node n3. At this time, the potential of the first clock signal provided by K1 jumps from a high voltage to a low voltage, and the potential of the third node n3 drops, so that T3 is turned on, and the first clock signal is written to the second node n2, so that T6 is turned on, the potential of n4 becomes a high voltage.

Figure 6:
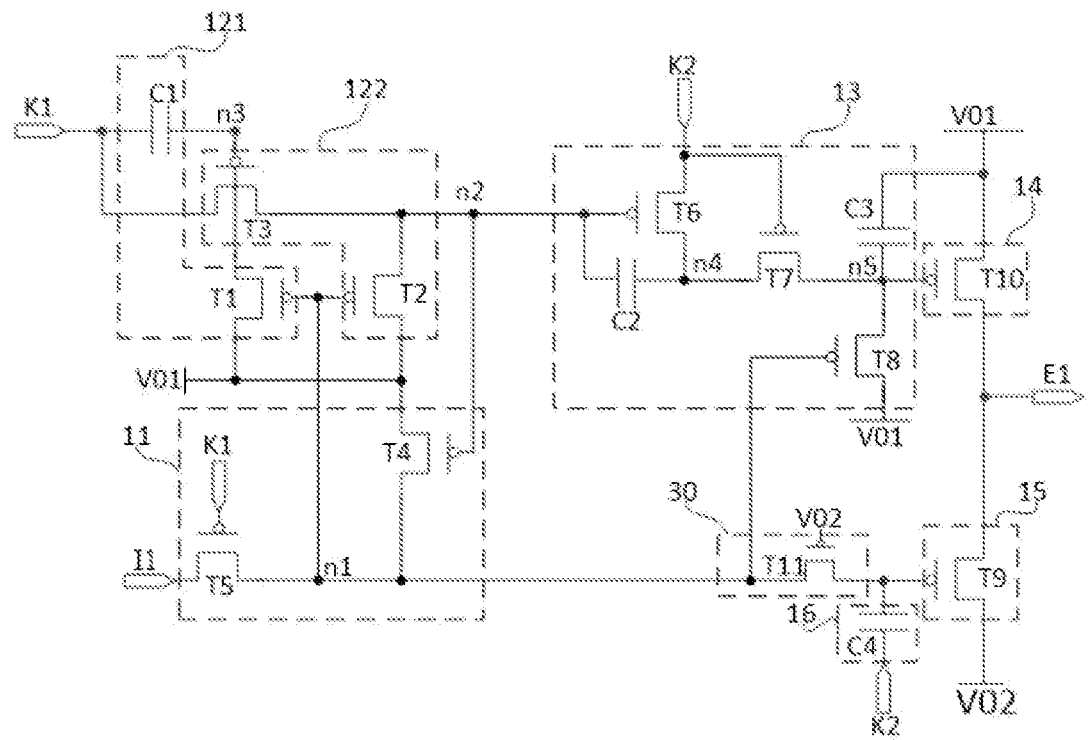
FIG. 6 is a circuit diagram of a shift register unit according to at least one embodiment of the present disclosure.

As shown in FIG. 6, the difference between the shift register unit described in at least one embodiment of the present disclosure and at least one embodiment of the shift register unit shown in FIG. 4 of the present disclosure is that a first isolation circuit 30 is added;

The first isolation circuit 30 includes a first isolation transistor T11.

The gate electrode of the first isolation transistor T11 is electrically connected to the low voltage terminal, the source electrode of the first isolation transistor T11 is electrically connected to the first node n1, and the drain electrode of the first isolation transistor T11 is electrically connected to the gate electrode of the ninth transistor T9; the low voltage terminal is used to provide a low voltage signal V02.

In at least one embodiment of the shift register unit shown in FIG. 6 of the present disclosure, T11 is added so that when the potential of the gate electrode of T9 is pulled down to an excessively low voltage, T11 can be turned off to prevent the excessively low voltage being transmitted to the first node n1, so as to ensure the stability of the circuit.

Figure 7:
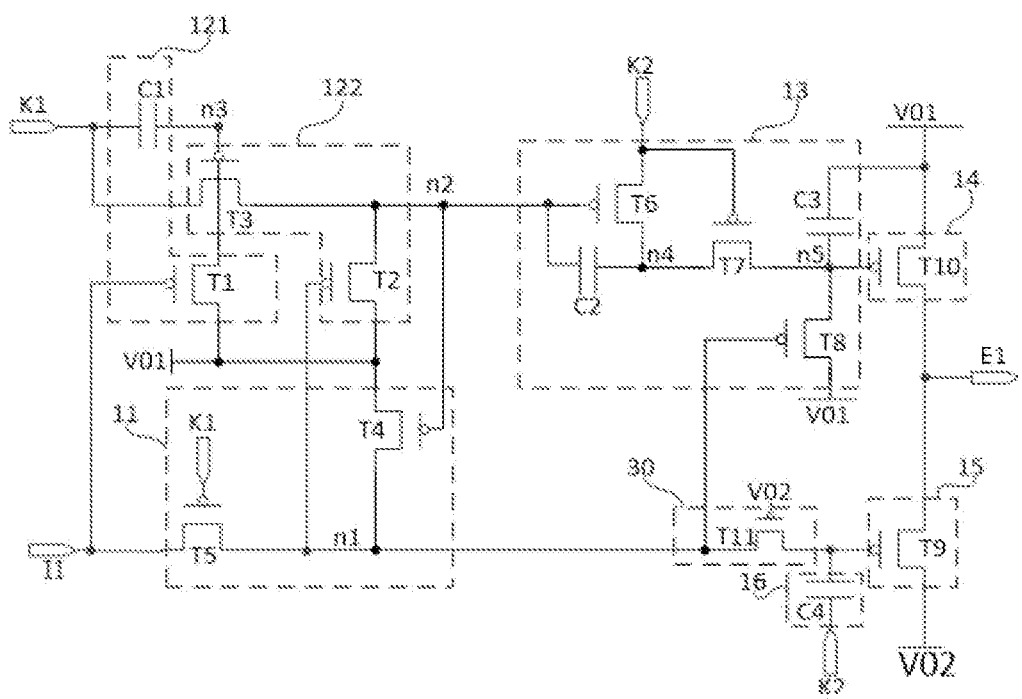
FIG. 7 is a circuit diagram of a shift register unit according to at least one embodiment of the present disclosure.

As shown in FIG. 7, the difference between the shift register unit described in at least one embodiment of the present disclosure and at least one embodiment of the shift register unit shown in FIG. 6 of the present disclosure is that the gate electrode of T1 is electrically connected to the input terminal I1.

In at least one embodiment of the shift register unit shown in FIG. 7, the node control terminal is the input terminal I1.

In the shift register unit of the present disclosure as shown in FIG. 7, the gate electrode of T1 is changed to be electrically connected to the input terminal I1, and the input signal provided by I1 directly controls to turn-on and turn-off T1. This design can make T1 is controlled by the high voltage of the input signal before the first phase S1, so that T1 is turned off before S1, so that in the first phase S1 it can be ensured that T3 is turned on in a better way, and the potential of n2 can be pulled down to a low voltage in a better way, so as to ensure that in the second phase S2, T6 can be turned on by bootstrapping in a better way, and at the same time T1 is no longer affected by the potential of the n1 node by the ECB coupling of C4, the stability of the entire shift register unit is better, the risk of competition is eliminated.

Figure 8:
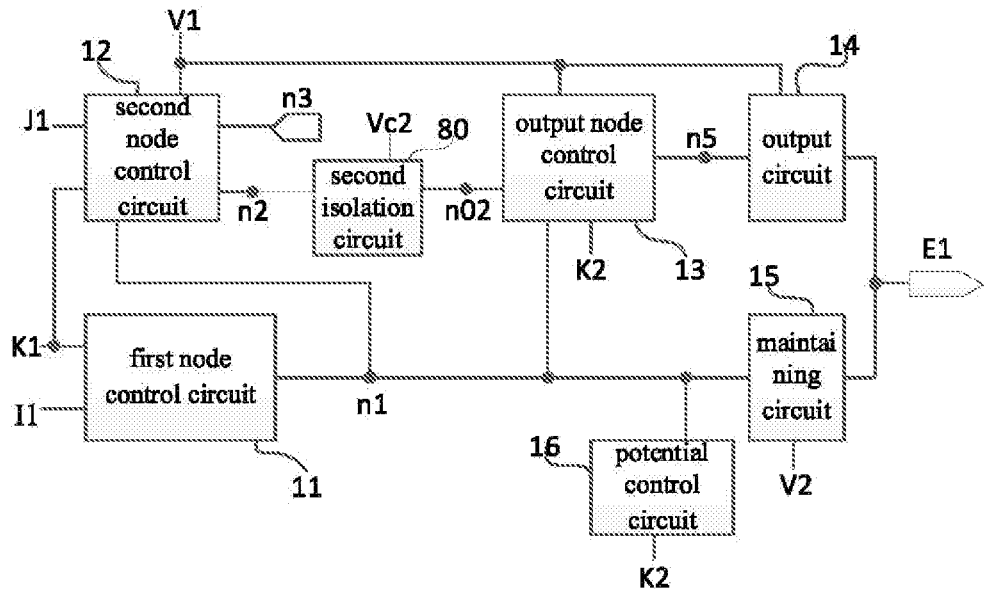
FIG. 8 is a structural diagram of a shift register unit according to at least one embodiment of the present disclosure.

As shown in FIG. 8, based on at least one embodiment of the shift register shown in FIG. 1, the shift register unit described in at least one embodiment of the present disclosure may further include a second isolation circuit 80;

The output node control circuit 13 is electrically connected to the second node n2 through the second isolation circuit 80;

The second isolation circuit 80 is used to control the connection or disconnection between the second node n2 and the output node control circuit 13 under the control of the second control voltage provided by the second control voltage terminal Vc2.

Optionally, when the second isolation transistor included in the second isolation circuit 80 is a p-type transistor, the second control voltage terminal may be a low voltage terminal.

In FIG. 8, the second isolation node is labeled n02, and the second isolation node n02 is the connection node between the output node control circuit 13 and the second isolation circuit 80.

The shift register unit according to at least one embodiment of the present disclosure may further include a second isolation circuit, which can prevent the potential of the second isolation node n02 from being affected when the potential of the second isolation node n02 is too low, so as to improve the stability of the circuit.

In at least one embodiment of the present disclosure, the second isolation circuit may include a second isolation transistor;

The output node control circuit is electrically connected to the second node through the second isolation transistor;

The control electrode of the second isolation transistor is electrically connected to the second control voltage terminal, the first electrode of the second isolation transistor is electrically connected to the second node, and the second electrode of the second isolation transistor is electrically connected to the output node control circuit.

In specific implementation, the first node control circuit may also be electrically connected to the first voltage terminal and the first control node respectively, and is also used to control the connection between the first node and the first voltage terminal under the control of the potential of the first control node.

The first control node is the second node or a node electrically connected to the output node control circuit.

Optionally, the first node control circuit may include a fourth transistor and a fifth transistor, wherein, The control electrode of the fourth transistor is electrically connected to the first control node, the first electrode of the fourth transistor is electrically connected to the first voltage terminal, and the second electrode of the fourth transistor is electrically connected to the first node.

The control electrode of the fifth transistor is electrically connected to the first clock signal terminal, the first electrode of the fifth transistor is electrically connected to the input terminal, and the second electrode of the fifth transistor is electrically connected to the first node.

Figure 9:
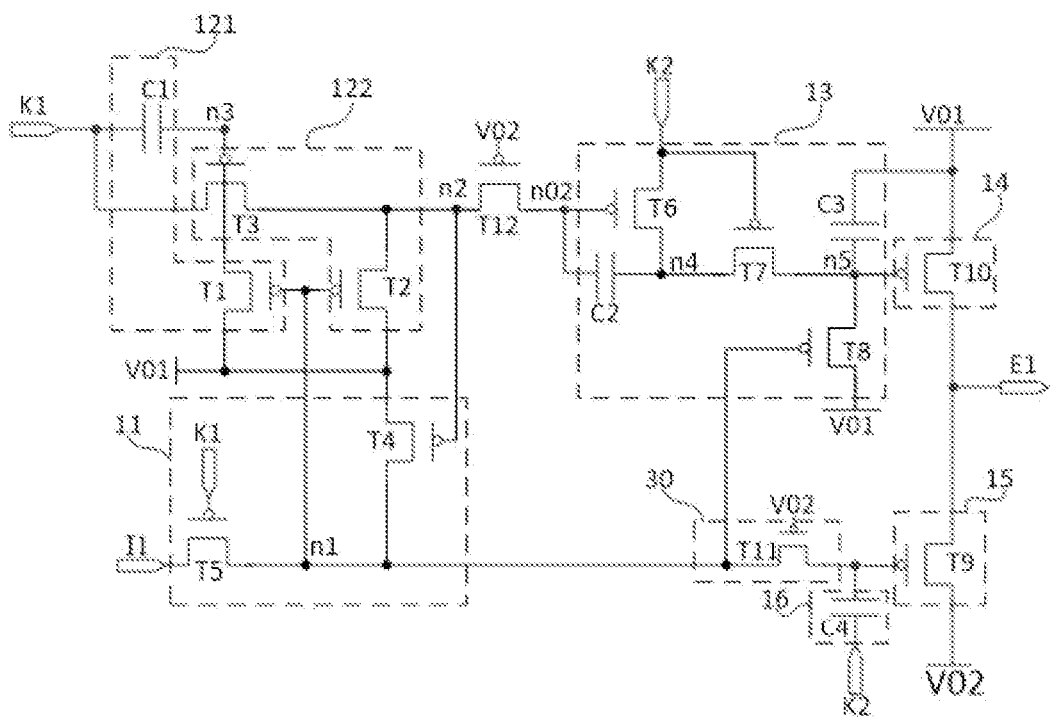
FIG. 9 is a circuit diagram of a shift register unit according to at least one embodiment of the present disclosure.

As shown in FIG. 9, the difference between the shift register unit described in at least one embodiment of the present disclosure and at least one embodiment of the shift register unit shown in FIG. 6 of the present disclosure is that a second isolation transistor T12 is added;

The gate electrode of T12 is electrically connected to the low voltage terminal; the low voltage terminal is used to provide a low voltage signal V02;

The source electrode of T12 is electrically connected to the second node n2, and the drain electrode of T12 is electrically connected to the gate electrode of T6;

In FIG. 8, the second isolation node is labeled n02, which is the node electrically connected to the gate electrode of T6;

T12 is a p-type thin film transistor, but not limited to this; in actual operation, T12 can also be a PMOS (P-type metal-oxide-semiconductor transistor).

Figure 10:
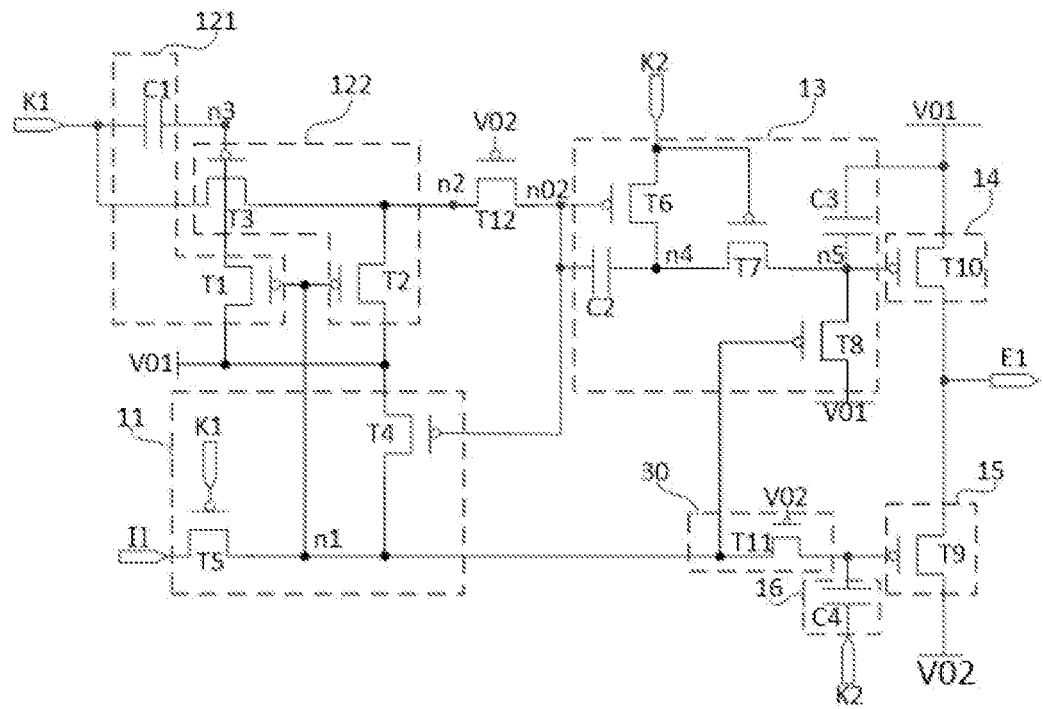
FIG. 10 is a circuit diagram of the shift register unit according to at least one embodiment of the present disclosure.

As shown in FIG. 10, the difference between the shift register unit described in at least one embodiment of the present disclosure and at least one embodiment of the shift register unit shown in FIG. 9 of the present disclosure is: the gate electrode of T4 is electrically connected to the second isolation node n02.

In the specific implementation, since the potential of n02 is more stable, the gate electrode of T4 can be set to be electrically connected to n02.

Figure 11:
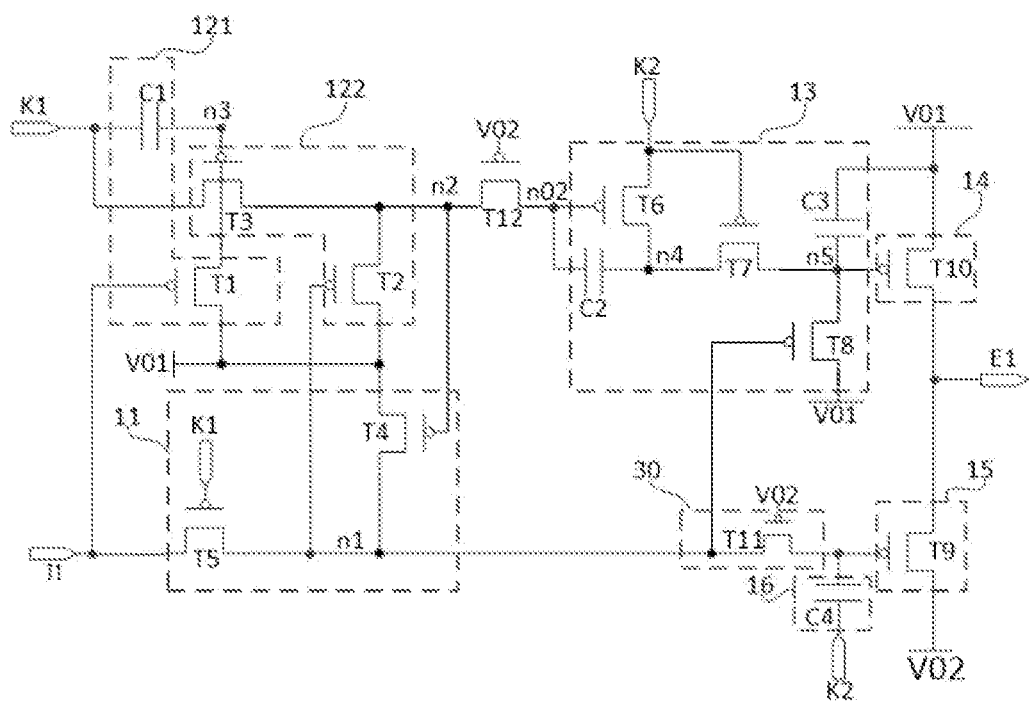
FIG. 11 is a circuit diagram of a shift register unit according to at least one embodiment of the present disclosure.

As shown in FIG. 11, the difference between the shift register unit described in at least one embodiment of the present disclosure and at least one embodiment of the shift register unit shown in FIG. 7 of the present disclosure is that a second isolation transistor T12 is added;

The gate electrode of T12 is electrically connected to the low voltage terminal; the low voltage terminal is used to provide a low voltage signal V02;

The source electrode of T12 is electrically connected to the second node n2, and the drain electrode of T12 is electrically connected to the gate electrode of T6;

In FIG. 11, the second isolation node is labeled n02, which is the node electrically connected to the gate electrode of T6;

T12 is a p-type thin film transistor, but not limited to this; in actual operation, T12 can also be a PMOS (P-type metal-oxide-semiconductor transistor).

In at least one embodiment of the shift register unit shown in FIGS. 13-17 of the present disclosure, T12 may also be added; when T12 is added, the gate electrode of T4 may be electrically connected to the second node n2 or the second isolation node n02.

Figure 12:
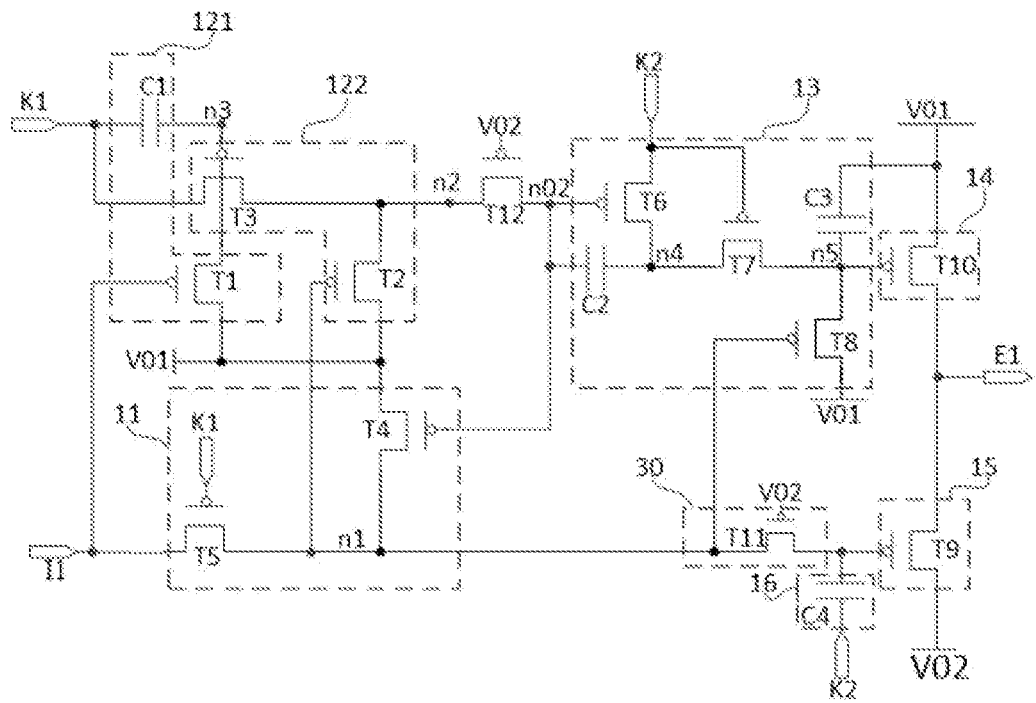
FIG. 12 is a circuit diagram of a shift register unit according to at least one embodiment of the present disclosure.

As shown in FIG. 12, the difference between the shift register unit described in at least one embodiment of the present disclosure and at least one embodiment of the shift register unit shown in FIG. 11 of the present disclosure is: the gate electrode of T4 is electrically connected to the second isolation node n02.

Figure 13:
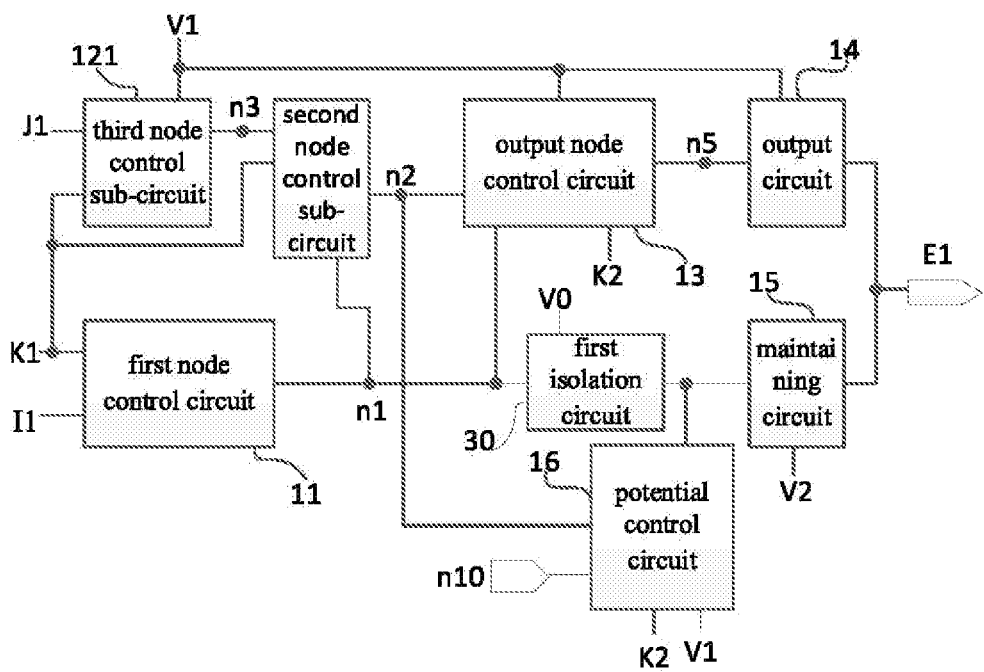
FIG. 13 is a structural diagram of a shift register unit according to at least one embodiment of the present disclosure.

As shown in FIG. 13, in at least one embodiment of the present disclosure, based on at least one embodiment of the shift register unit shown in FIG. 3, The potential control circuit 16 may also be electrically connected to the second node n2, the first voltage terminal V1, and the second control node n10, respectively, is configured to control the connection between the second control node n10 and the first voltage terminal V1 under the control of the potential of the second node n2, and control the connection between the second control node n10 and the second clock signal terminal K2 under the control of the potential of the control terminal of the maintaining circuit 15, and control the potential of the control terminal of the maintaining circuit 15 according to the potential of the second control node n10.

When the shift register unit shown in FIG. 13 of at least one embodiment of the present disclosure is in operation, in the first and second phases, the potential control circuit 16 controls the connection the second control node n10 and the first voltage terminal V1 under the control of the potential of the second node n2, and control the second control node n10 to be disconnected from the second clock signal terminal K2 under the control of the potential of the control terminal of the maintaining circuit 15, so that the second clock signal will not affect the potential of the control terminal of the maintaining circuit 15; in other phases other than the first phase and the second phase, the potential control circuit 16 controls the second control node n10 to be disconnected from the first voltage terminal V1 under the control of the potential of the second node n2, and the potential control circuit 16 controls the connection between the second control node n10 and the second clock signal terminal K2 under the control of the potential of the control terminal of the maintaining circuit 15, and controls the potential of the control terminal of the maintaining circuit 15 according to the potential of the second control node n10.

Optionally, the potential control circuit includes a fourth capacitor, a thirteenth transistor, and a fourth transistor;

The control electrode of the fourth transistor is electrically connected to the second node, the first electrode of the fourth transistor is electrically connected to the first voltage terminal, and the second electrode of the fourth transistor is electrically connected to the second control node.

The control electrode of the thirteenth transistor is electrically connected to the control terminal of the maintaining circuit, the first electrode of the thirteenth transistor is electrically connected to the second control node, and the second electrode of the thirteenth transistor is electrically connected to the second clock signal terminal;

The first terminal of the fourth capacitor is electrically connected to the control terminal of the maintaining circuit, and the second terminal of the fourth capacitor is electrically connected to the second control node.

Figure 14:
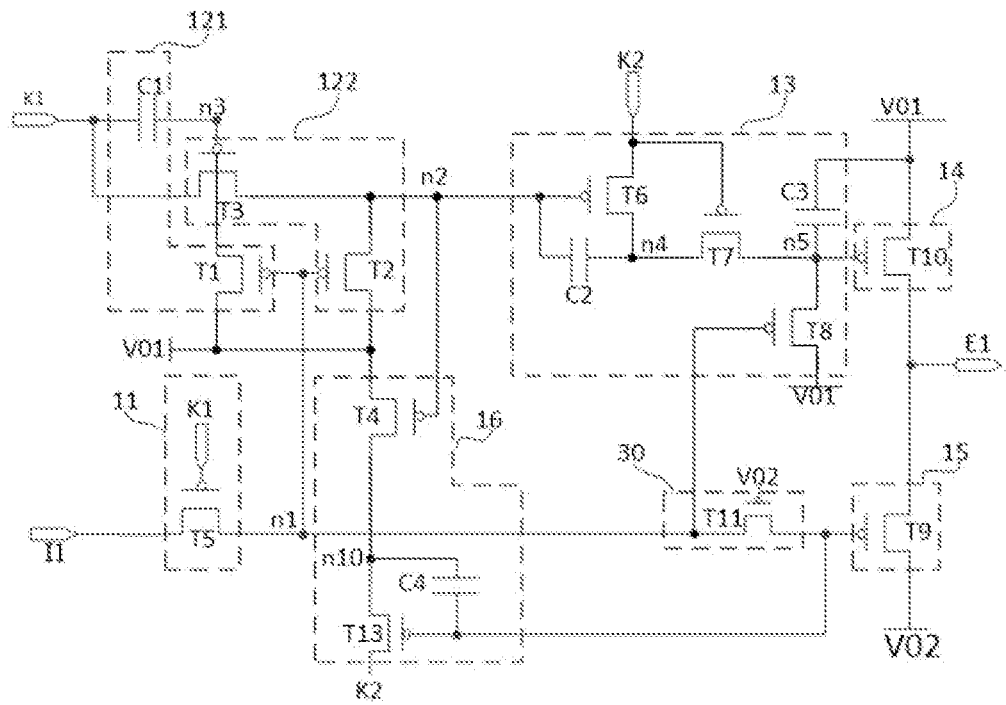
FIG. 14 is a circuit diagram of a shift register unit according to at least one embodiment of the present disclosure.

As shown in FIG. 14, the difference between the shift register unit described in at least one embodiment of the present disclosure and at least one embodiment of the shift register unit shown in FIG. 6 are that T4 is included in the potential control circuit 16, the drain electrode of T4 is electrically connected to the second control node n10, and the second terminal of C4 is electrically connected to the second control node n10; and as shown in FIG. 13, the shift register unit according to at least one embodiment of the present disclosure further includes the thirteenth transistor T13; the gate electrode of T13 is electrically connected to the gate electrode of the ninth transistor T9, the source electrode of T13 is electrically connected to the second control node n10, and the drain electrode of T13 is electrically connected to the second clock signal terminal K2.

In at least one embodiment shown in FIG. 14, the potential control circuit 16 includes T4, T13, and C4.

In at least one embodiment shown in FIG. 14, all the transistors are p-type thin film transistors, but not limited to this; in actual operation, the transistors may also be PMOS transistors.

When at least one embodiment of the present disclosure shown in FIG. 14 is in operation, In the first phase, the input signal provided by I1 is a high voltage signal, the first clock signal provided by K1 is a low voltage signal, T5 is turned on, and the input signal is written into the capacitor C4 through T5, and the potential of n1 is a high voltage at this time; the potential of n2 is a low voltage, T4 is turned on, so that n10 is connected to the high voltage signal V01, so that the second terminal of C4 is connected to the high voltage signal V01; the potential of n1 is a high voltage, T13 is turned off, so that the second terminal of C4 is not connected to the second clock signal terminal to prevent the voltage change of the second clock signal from affecting the potential of the gate electrode of T9;

In the second phase, the potential of n1 is maintained at a high voltage, the potential of the gate electrode of T9 is at a high voltage, and T13 is turned off; the potential of n2 is at a low voltage, and T4 is turned on, so that n10 is connected to the high voltage signal V01;

In the third phase, T5 is turned on, the potential of n1 is pulled down, and then the potential of the gate electrode of T9 is pulled down, the potential of the gate electrode of T9 is a low voltage, T13 is turned on, the potential of n2 is high, and T4 is turned off, so that the second terminal of C4 is electrically connected to the second clock signal terminal K2;

In the fourth phase, T5 and T4 are turned off, and the potential of T9 is maintained at a low voltage, so that T13 is turned on. At this time, the second terminal of C2 is in a floating state, and the potential of the second clock signal is reduced from a high voltage to a low voltage. Therefore, the potential of the gate electrode of T9 is further pulled down, so that the potential of the signal outputted by E1 can be pulled down.

Figure 15:
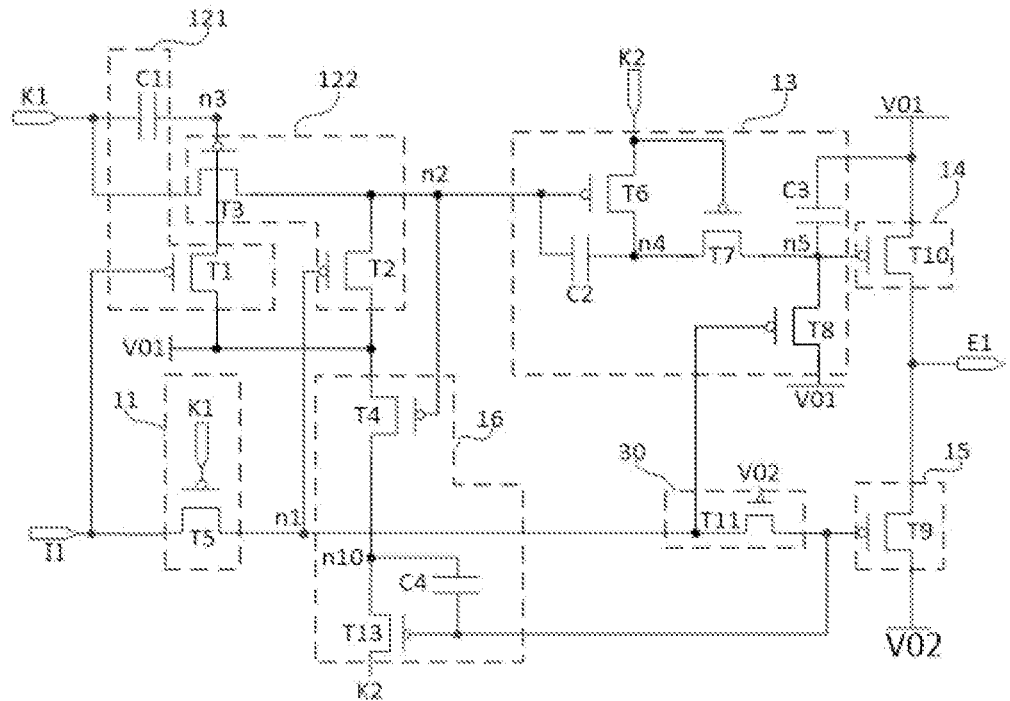
FIG. 15 is a circuit diagram of a shift register unit according to at least one embodiment of the present disclosure.

As shown in FIG. 15, the difference between the shift register unit described in at least one embodiment of the present disclosure and at least one embodiment of the shift register unit shown in FIG. 14 of the present disclosure is that the gate electrode of T1 is electrically connected to the input terminal I1.

In at least one embodiment of the shift register unit shown in FIG. 15, the node control terminal is the input terminal I1.

In at least one embodiment of the shift register unit of the present disclosure as shown in FIG. 15, the gate electrode of T1 is changed to be electrically connected to the input terminal I1, and the input signal provided by I1 directly controls the turn-on and turn-off of T1. T1 is controlled by the high voltage of the input signal before the first phase S1 by such design, so that T1 is turned off before S1, so that T3 is turned on in a better way in the first phase S1, and the potential of n2 can be pulled down to a low voltage in a better way, so that in the second phase S2, T6 can be bootstrapped and turned on in a better way, and at the same time T1 is no longer affected by the potential of the n1 node by the ECB coupling of C4, so as to improve the stability of the entire shift register unit and eliminate the risk of competition.

Figure 16:
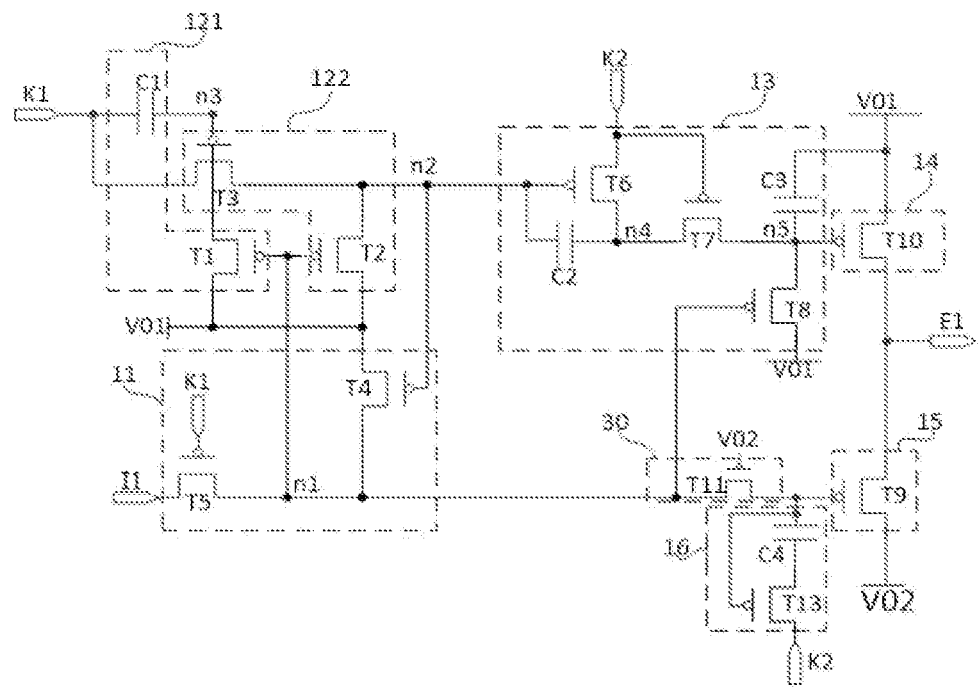
FIG. 16 is a circuit diagram of a shift register unit according to at least one embodiment of the present disclosure.

As shown in FIG. 16, the difference between the shift register unit described in at least one embodiment of the present disclosure and at least one embodiment of the shift register unit shown in FIG. 6 of the present disclosure is that the potential control circuit 16 further includes the thirteenth transistor T13;

The second terminal of C4 is electrically connected to the source electrode of T13;

The gate electrode of T13 is electrically connected to the gate electrode of T9, and the drain electrode of T9 is electrically connected to the second clock signal terminal K2.

In at least one embodiment of the shift register unit shown in FIG. 16, all the transistors are p-type thin film transistors, but not limited to this.

When at least one embodiment of the shift register unit shown in FIG. 16 of the present disclosure is in operation, in the first phase, the potential of the gate electrode of T9 is a high voltage, and T13 is turned off, then the second terminal of C2 is not connected to the second clock signal, so the change of the potential of the second clock signal will not affect the potential of the gate electrode of T9, so as to ensure that E1 can output a high voltage;

In the third and fourth phases, the potential of the gate electrode of T9 is a low voltage, T13 is turned on, and the second terminal of C2 is connected to the second clock signal. When the potential of the second clock signal changes from a high voltage to a low voltage, the potential of the gate electrode of T9 is further decreased, so that E1 can output a lower voltage.

Figure 17:
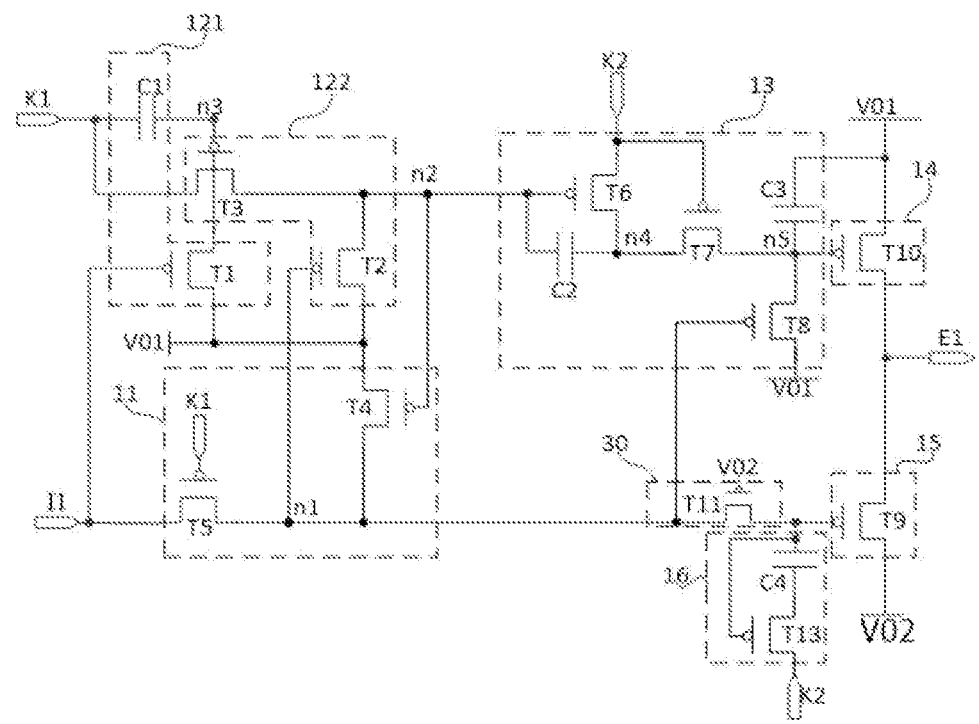
FIG. 17 is a circuit diagram of a shift register unit according to at least one embodiment of the present disclosure.

As shown in FIG. 17, the difference between the shift register unit described in at least one embodiment of the present disclosure and at least one embodiment of the shift register unit shown in FIG. 16 of the present disclosure is that the gate electrode of T1 is electrically connected to the input terminal I1.

In at least one embodiment of the shift register unit shown in FIG. 17, the node control terminal is the input terminal I1.

In at least one embodiment of the shift register unit of the present disclosure as shown in FIG. 17, the gate electrode of T1 is changed to be electrically connected to the input terminal I1, and the input signal provided by I1 directly controls the turn-on and turn-off of T1. T1 is controlled by the high voltage of the input signal before the first phase S1 by such design, so that T1 is turned off before S1, T3 is turned on in a better way in the first phase S1, and the potential of n2 can be pulled down to a low voltage in a better way, so as to ensure that in the second phase S2, T6 can be bootstrapped and turned on in a better way, and at the same time, T1 is no longer affected by the potential of the n1 node by the ECB coupling of C4, so as to improve the stability of the entire shift register unit, and eliminate the risk of competition.

The driving method according to the embodiment of the present disclosure is applied to the above-mentioned shift register unit, and the driving cycle includes a first phase, a second phase, and a third phase arranged in sequence; the driving method includes:

In the first phase, the first node control circuit controls the potential of the first node to the first voltage, and the potential control circuit maintains the potential of the first node to the first voltage; the second node control circuit controls the potential of the second node to the second voltage, the output node control circuit controls the potential of the output node to maintain at the first voltage, and the output circuit and the maintaining circuit control the output terminal to maintain the output of the second voltage signal;

In the second phase, the first node control circuit controls the potential of the first node to the first voltage, the second node control circuit controls the potential of the second node to the second voltage, and the output node control circuit controls the potential of the output node to the second voltage, and the output circuit controls the output terminal to output the first voltage signal;

In the third phase, the first node control circuit controls the potential of the first node to be the second voltage, the potential control circuit maintains the potential of the first node to the second voltage, and the second node control circuit controls the potential of the second node to the first voltage, the output node control circuit controls the potential of the output node to be the first voltage, and the maintaining circuit controls the output terminal to output a second voltage signal.

In the embodiments of the present disclosure, a shift register unit that outputs a high-level pulse can be constructed by using a p-type transistor.

In a specific implementation, the driving cycle further includes a fourth phase arranged after the third phase; the driving method further includes:

In the fourth phase, the second node control circuit controls the potential of the second node to the first voltage, the potential control circuit controls to pull down the potential of the first node, and the maintaining circuit controls the output terminal to output a second voltage signal.

Optionally, the driving method described in at least one embodiment of the present disclosure may specifically include:

In the first phase, the input signal provided by the input terminal is the first voltage signal, the first clock signal provided by the first clock signal terminal is the second voltage signal, and the second clock signal provided by the second clock signal terminal is the first voltage signal, the first node control circuit writes the input signal to the first node under the control of the first clock signal; the second node control circuit correspondingly changes the potential of the third node according to the first clock signal, so that the second node control circuit controls the first clock signal terminal to write the first clock signal to the second node under the control of the potential of the third node; the potential control circuit maintains the potential of the first node at the first voltage, the output node control circuit controls the potential of the output node to maintain at the first voltage under the control of the potential of the first node, the potential of the second node and the second clock signal, and the output circuit and the maintaining circuit control the output terminal to maintain the output of the second voltage signal;

In the second phase, the input signal is the second voltage signal, the first clock signal is the first voltage signal, the second clock signal is the second voltage signal, and the first node control circuit controls the potential of the first node to be the first voltage; the second node control circuit sets the potential of the third node to the first voltage according to the potential of the node control terminal and the first clock signal, and the second node control circuit controls the potential of the second node to be the second voltage under the control of the potential of the third node and the potential of the first node; the output node control circuit controls the potential of the output node to the second voltage under the control of the potential of the second node and the second clock signal, and the output circuit controls the connection between the output terminal and the first voltage terminal to control the output terminal to output the first voltage signal under the control of the potential of the output node;

In the third phase, the input signal is the second voltage signal, the first clock signal is the second voltage signal, and the second clock signal is the first voltage signal. The first node control circuit controls to write the input signal into the first node under the control of the first clock signal, so that the potential of the first node is the second voltage, and the potential control circuit maintains the potential of the first node at the second voltage; the second node control circuit controls the potential of the third noted to be the first voltage according to the potential of the node control terminal, the first voltage signal and the first clock signal; the second node control circuit controls the potential of the second node to be the first voltage under the control of the potential of the third node and the potential of the first node, the output node control circuit controls the potential of the output node to the first voltage under the control of the potential of the first node; the maintaining circuit controls the output terminal to output the second voltage signal under the control of the potential of the first node.

In a specific implementation, the driving cycle may further include a fourth phase arranged after the third phase; the driving method may further include:

In the fourth phase, the input signal is the second voltage signal, the first clock signal is the first voltage signal, and the second clock signal is the second voltage signal. The potential control circuit controls to pull down the potential of the first node, and the second node control circuit controls the potential of the second node to be the first voltage, the output node control circuit controls the potential of the output node to be the first voltage, and the maintaining circuit controls to pull down the potential of the signal outputted by the output terminal under the control of the potential of the first node.

The driving circuit according to the embodiment of the present disclosure includes a plurality of stages of the above-mentioned shift register units.

In at least one embodiment of the present disclosure, the driving circuit may be a light emitting control signal generating circuit, but it is not limited to this.

Figure 18:
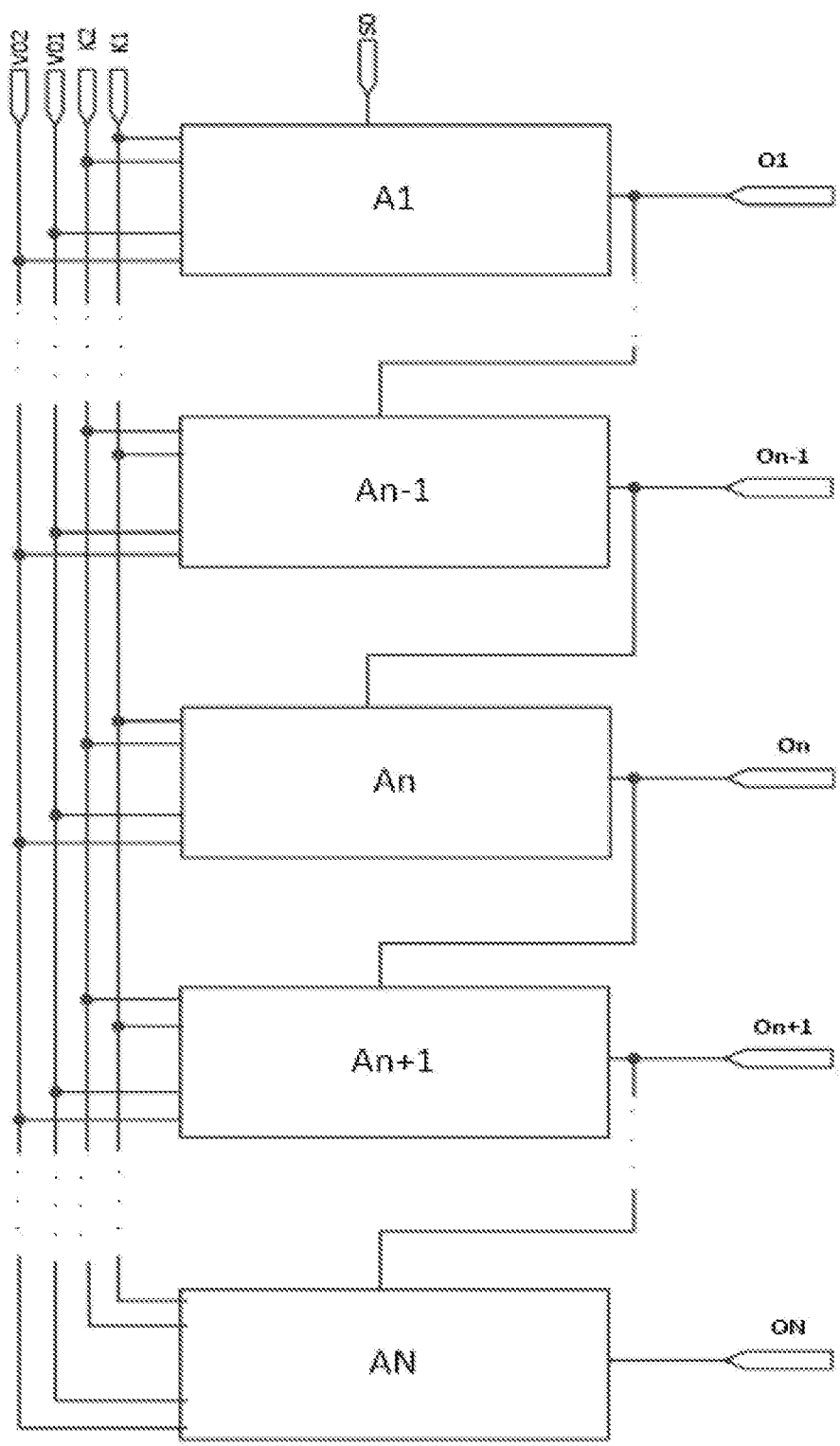
FIG. 18 is a structural diagram of the driving circuit according to at least one embodiment of the present disclosure.

As shown in FIG. 18, the driving circuit according to at least one embodiment of the present disclosure includes a plurality of stages of shift register units;

In FIG. 18, A1 is the first stage of shift register unit included in the driving circuit, An−1 is the (n−1)th stage of shift register unit included in the driving circuit, and An is the n-th stage of shift register unit included in the driving circuit, An+1 is the (n+1)th stage of shift register unit included in the driving circuit, and AN is the Nth stage of shift register unit included in the driving circuit.

n is an integer greater than 1, and N is an integer greater than n+1.

As shown in FIG. 18, the input terminal of A1 is connected to the start signal S0; except for A1, the input terminal of each stage of shift register unit is electrically connected to the output terminal of an adjacent previous stage of shift register unit;

The input terminal of An is electrically connected with the output terminal On−1 of An−1, and the input terminal of An+1 is electrically connected with the output terminal On of An;

In FIG. 18, O1 is the output terminal of A1, On−1 is the output terminal of An−1, On is the output terminal of An, On+1 is the output terminal of An+1, and ON is the output terminal of AN.

In FIG. 18, K1 is the first clock signal terminal, K2 is the second clock signal terminal, V01 is a high voltage signal, and V02 is a low voltage signal.

The display device according to the embodiment of the present disclosure includes the above-mentioned driving circuit.

The display device provided by the embodiments of the present disclosure may be any product or component with a display function, such as a mobile phone, a tablet computer, a television, a monitor, a notebook computer, a digital photo frame, a navigator, and the like.

The above are the optional embodiments of the present disclosure. It should be pointed out that for those of ordinary skill in the art, several improvements and modifications can be made without departing from the principles described in the present disclosure, and these improvements and modifications should be within the protection scope of the present disclosure.

What is claimed is:

1. A shift register unit comprising a first node control circuit, a second node control circuit, an output node control circuit, an output circuit, a maintaining circuit, and a potential control circuit, wherein:
   the first node control circuit is electrically connected to a first clock signal terminal, an input terminal, and a first node, and is configured to control the connection between the input terminal and the first node under the control of a first clock signal provided by the first clock signal terminal;
   the second node control circuit is electrically connected to a node control terminal, the first clock signal terminal, a first voltage terminal, the first node, a second node, and a third node, respectively, is configured to control a potential of the third node according to a potential of the node control terminal, a first voltage signal provided by the first voltage terminal, and the first clock signal, and control a potential of the second node according to the first clock signal and the first voltage signal under the control of the potential of the third node and a potential of the first node;
   the output node control circuit is electrically connected to the first node, the second node, a second clock signal terminal, an output node, and the first voltage terminal, respectively, and is configured to control a potential of the output node under the control of the potential of the second node and a second clock signal provided by the second clock signal terminal according to the second clock signal, and control the connection between the output node and the first voltage terminal under the control of the potential of the first node, and is configured to maintain the potential of the output node;
   the output circuit is electrically connected to the output node, the first voltage terminal, and an output terminal, respectively, is configured to control the connection between the output terminal and the first voltage terminal under the control of the potential of the output node;
   the potential control circuit is electrically connected to a control terminal of the maintaining circuit and the second clock signal terminal, respectively, is configured to control a potential of the control terminal of the maintaining circuit according to the second clock signal;
   the control terminal of the maintaining circuit is electrically connected to the first node, the maintaining circuit is also electrically connected to the output terminal and the second voltage terminal, is configured to control the connection between the output terminal and the second voltage terminal under the control of a potential of the control terminal of the maintaining circuit.

2. The shift register unit according to claim 1, wherein the second node control circuit comprises a third node control sub-circuit and a second node control sub-circuit, wherein,
   the third node control sub-circuit is electrically connected to the node control terminal, the third node, the first voltage terminal, and the first clock signal terminal, respectively, and is configured to control the connection between the third node and the first voltage terminal under the control of the potential of the node control terminal, and control the potential of the third node according to the first clock signal;
   the second node control sub-circuit is electrically connected to the third node, the second node, the first clock signal terminal, the first node, and the first voltage terminal, respectively, is configured to control the connection between the second node and the first clock signal terminal under the control of the potential of the third node, and control the connection between the second node and the first voltage terminal under the control of the potential of the first node.

3. The shift register unit according to claim 2, wherein the third node control sub-circuit includes a first transistor and a first capacitor;
   a control electrode of the first transistor is electrically connected to the node control terminal, a first electrode of the first transistor is electrically connected to the first voltage terminal, and a second electrode of the first transistor is electrically connected to the third node;
   a first terminal of the first capacitor is electrically connected to the first clock signal terminal, and a second terminal of the first capacitor is electrically connected to the third node.

4. The shift register unit according to claim 2, wherein the second node control sub-circuit includes a second transistor and a third transistor, wherein,
   a control electrode of the second transistor is electrically connected to the first node, a first electrode of the second transistor is electrically connected to the first voltage terminal, and a second electrode of the second transistor is electrically connected to the second node;
   a control electrode of the third transistor is electrically connected to the third node, a first electrode of the third transistor is electrically connected to the first clock signal terminal, and a second electrode of the third transistor is electrically connected to the second node.

5. The shift register unit according to claim 1, wherein node control terminal is the input terminal or the first node.

6. The shift register unit according to claim 1, wherein the first node control circuit is electrically connected to the first voltage terminal and the second node, and is configured to control the connection between the first node and the first voltage terminal under the control of the potential of the second node,
   wherein the first node control circuit includes a fourth transistor and a fifth transistor, wherein,
   a control electrode of the fourth transistor is electrically connected to the second node, a first electrode of the fourth transistor is electrically connected to the first voltage terminal, and a second electrode of the fourth transistor is electrically connected to the first node;
   a control electrode of the fifth transistor is electrically connected to the first clock signal terminal, a first electrode of the fifth transistor is electrically connected to the input terminal, and a second electrode of the fifth transistor is electrically connected to the first node.

7. The shift register unit according to claim 1, further comprising a first isolation circuit, wherein the control terminal of the maintaining circuit is electrically connected to the first node through the first isolation circuit;

the first isolation circuit is configured to control the connection or disconnection between the first node and the control terminal of the maintaining circuit under the control of a first control voltage provided by a first control voltage terminal, wherein the first isolation circuit includes a first isolation transistor, a control electrode of the first isolation transistor is electrically connected to the first control voltage terminal, and a first electrode of the first isolation transistor is electrically connected to the first node, and a second electrode of the first isolation transistor is electrically connected to the control terminal of the maintaining circuit;

the first control voltage terminal is the second voltage terminal.

8. The shift register unit according to claim 7, wherein the potential control circuit is electrically connected to the second node, the first voltage terminal, and the second control node, respectively, is configured to control the connection between the second control node and the first voltage terminal under the control of the potential of the second node, and control the connection between the second control node and the second clock signal terminal under the control of the potential of the control terminal of the maintaining circuit, and control the potential of the control terminal of the maintaining circuit according to the potential of the second control node, wherein the potential control circuit includes a fourth capacitor, a thirteenth transistor, and a fourth transistor;

a control electrode of the fourth transistor is electrically connected to the second node, a first electrode of the fourth transistor is electrically connected to the first voltage terminal, and a second electrode of the fourth transistor is electrically connected to the second control node;

a control electrode of the thirteenth transistor is electrically connected to the control terminal of the maintaining circuit, a first electrode of the thirteenth transistor is electrically connected to the second control node, and a second electrode of the thirteenth transistor is electrically connected to the second clock signal terminal;

a first terminal of the fourth capacitor is electrically connected to the control terminal of the maintaining circuit, and a second terminal of the fourth capacitor is electrically connected to the second control node.

9. The shift register unit according to claim 1, further comprising a second isolation circuit;

the output node control circuit is electrically connected to the second node through the second isolation circuit;

the second isolation circuit is configured to control the connection or disconnection between the second node and the output node control circuit under the control of a second control voltage provided by a second control voltage terminal.

10. The shift register unit according to claim 9, wherein the second isolation circuit comprises a second isolation transistor;

the output node control circuit is electrically connected to the second node through the second isolation transistor;

a control electrode of the second isolation transistor is electrically connected to the second control voltage terminal, a first electrode of the second isolation transistor is electrically connected to the second node, and a second electrode of the second isolation transistor is electrically connected to the output node control circuit.

11. The shift register unit according to claim 10, wherein the first node control circuit is electrically connected to the first voltage terminal and a first control node respectively, and is configured to control the connection between the first node and the first voltage terminal under the control of the potential of the first control node;

the first control node is the second node or a node electrically connected to the output node control circuit, wherein the first node control circuit includes a fourth transistor and a fifth transistor, wherein, a control electrode of the fourth transistor is electrically connected to the first control node, a first electrode of the fourth transistor is electrically connected to the first voltage terminal, and a second electrode of the fourth transistor is electrically connected to the first node;

a control electrode of the fifth transistor is electrically connected to the first clock signal terminal, a first electrode of the fifth transistor is electrically connected to the input terminal, and a second electrode of the fifth transistor is electrically connected to the first node.

12. The shift register unit according to claim 1, wherein the output node control circuit includes a sixth transistor, a seventh transistor, an eighth transistor, a second capacitor, and a third capacitor, wherein, a control electrode of the sixth transistor is electrically connected to the second node, a first electrode of the sixth transistor is electrically connected to the second clock signal terminal, and a second electrode of the sixth transistor is electrically connected to a fourth node;

a control electrode of the seventh transistor is electrically connected to the second clock signal terminal, a first electrode of the seventh transistor is electrically connected to the fourth node, and a second electrode of the seventh transistor is electrically connected to the output node;

a control electrode of the eighth transistor is electrically connected to the first node, a first electrode of the eighth transistor is electrically connected to the first voltage terminal, and a second electrode of the eighth transistor is electrically connected to the output node;

a first terminal of the second capacitor is electrically connected to the control electrode of the sixth transistor, and a second terminal of the second capacitor is electrically connected to the fourth node;

a first terminal of the third capacitor is electrically connected to the output node, and a second terminal of the third capacitor is electrically connected to the first voltage terminal.

13. The shift register unit according to claim 1, wherein the maintaining circuit includes a ninth transistor, and the output circuit includes a tenth transistor, wherein, a control electrode of the ninth transistor is electrically connected to the control terminal of the maintaining circuit, a first electrode of the ninth transistor is electrically connected to the output terminal, and a second electrode of the ninth transistor is electrically connected to the second voltage terminal;

a control electrode of the tenth transistor is electrically connected to the output node, a first electrode of the tenth transistor is electrically connected to the first voltage terminal, and a second electrode of the tenth transistor is electrically connected to the output terminal.

14. The shift register unit according to claim 1, wherein the potential control circuit includes a fourth capacitor; a first terminal of the fourth capacitor is electrically connected to the control terminal of the maintaining circuit, and a second terminal of the fourth capacitor is electrically connected to the second clock signal terminal; or, the potential control circuit includes the fourth capacitor and a thirteenth transistor; the first terminal of the fourth capacitor is electrically connected to the control terminal of the maintaining circuit; a control electrode of the thirteenth transistor is connected to the control terminal of the maintaining circuit, a first electrode of the thirteenth transistor is connected to the second terminal of the fourth capacitor, and a second electrode of the thirteenth transistor is electrically connected to the second clock signal terminal.

15. A driving method applied to the shift register unit according to claim 1, the driving cycle includes a first phase, a second phase, and a third phase arranged in sequence; the driving method includes:

in the first phase, the first node control circuit controlling the potential of the first node to be the first voltage, and the potential control circuit maintaining the potential of the first node at the first voltage; the second node control circuit controlling the potential of the second node to be the second voltage, the output node control circuit controlling the potential of the output node to maintain at the first voltage, and the output circuit and the maintaining circuit controlling the output terminal to maintain the output of the second voltage signal;

in the second phase, the first node control circuit controlling the potential of the first node to be the first voltage, the second node control circuit controlling the potential of the second node to the second voltage, and the output node control circuit controlling the potential of the output node to be the second voltage, and the output circuit controlling the output terminal to output the first voltage signal;

in the third phase, the first node control circuit controlling the potential of the first node to be the second voltage, the potential control circuit maintaining the potential of the first node at the second voltage, and the second node control circuit controlling the potential of the second node to be the first voltage, the output node control circuit controlling the potential of the output node to be the first voltage, and the maintaining circuit controlling the output terminal to output the second voltage signal.

16. The driving method according to claim 15, wherein the driving cycle further includes a fourth phase arranged after the third phase; the driving method further includes:

in the fourth phase, the second node control circuit controlling the potential of the second node to be the first voltage, the potential control circuit controlling to pull down the potential of the first node, and the maintaining circuit controlling the output terminal to output the second voltage signal.

17. The driving method according to claim 15, wherein the driving method specifically comprises:

in the first phase, the input signal provided by the input terminal being the first voltage signal, the first clock signal provided by the first clock signal terminal being the second voltage signal, and the second clock signal provided by the second clock signal terminal being the first voltage signal, the first node control circuit writing the input signal to the first node under the control of the first clock signal; the second node control circuit correspondingly changing the potential of the third node according to the first clock signal, so that the second node control circuit controls the first clock signal terminal to write the first clock signal to the second node under the control of the potential of the third node; the potential control circuit maintaining the potential of the first node at the first voltage, the output node control circuit controlling the potential of the output node to maintain at the first voltage under the control of the potential of the first node, the potential of the second node and the second clock signal, and the output circuit and the maintaining circuit controlling the output terminal to maintain the output of the second voltage signal;

in the second phase, the input signal being the second voltage signal, the first clock signal being the first voltage signal, the second clock signal being the second voltage signal, and the first node control circuit controlling the potential of the first node to be the first voltage; the second node control circuit setting the potential of the third node to the first voltage according to the potential of the node control terminal and the first clock signal, and the second node control circuit controlling the potential of the second node to be the second voltage under the control of the potential of the third node and the potential of the first node; the output node control circuit controlling the potential of the output node to be the second voltage under the control of the potential of the second node and the second clock signal, and the output circuit controlling the connection between the output terminal and the first voltage terminal under the control of the potential of the output node, to control the output terminal to output the first voltage signal;

in the third phase, the input signal being the second voltage signal, the first clock signal being the second voltage signal, and the second clock signal being the first voltage signal, the first node control circuit controlling to write the input signal into the first node under the control of the first clock signal, so that the potential of the first node is the second voltage, and the potential control circuit maintaining the potential of the first node at the second voltage; the second node control circuit controlling the potential of the third noted to be the first voltage according to the potential of the node control terminal, the first voltage signal and the first clock signal; the second node control circuit controlling the potential of the second node to be the first voltage under the control of the potential of the third node and the potential of the first node, the output node control circuit controlling the potential of the output node to be the first voltage under the control of the potential of the first node; the maintaining circuit controlling the output terminal to output the second voltage signal under the control of the potential of the first node.

18. The driving method according to claim 17, wherein the driving cycle further includes a fourth phase arranged after the third phase; the driving method further includes:

in the fourth phase, the input signal being the second voltage signal, the first clock signal being the first voltage signal, and the second clock signal being the second voltage signal, the potential control circuit controlling to pull down the potential of the first node, and the second node control circuit controlling the potential of the second node to be the first voltage, the output node control circuit controlling the potential of the output node to be the first voltage, and the maintaining circuit controlling to pull down the potential of the signal outputted by the output terminal under the control of the potential of the first node.

19. A driving circuit comprising a plurality of stages of shift register units according to claim 1.

20. A display device comprising the driving circuit according to claim 19.

\* \* \* \* \*